(12) United States Patent
Wang et al.

(10) Patent No.: US 11,715,777 B2
(45) Date of Patent: Aug. 1, 2023

(54) SEMICONDUCTOR DEVICE AND METHOD

(71) Applicant: Taiwan Semiconductor Manufacturing Co., Ltd., Hsinchu (TW)

(72) Inventors: Guan-Ren Wang, Hsinchu (TW); Yun-Min Chang, Hsinchu (TW); Yu-Lien Huang, Jhubei (TW); Ching-Feng Fu, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 52 days.

(21) Appl. No.: 16/887,219

(22) Filed: May 29, 2020

(65) Prior Publication Data
US 2021/0376101 A1 Dec. 2, 2021

(51) Int. Cl.
*H01L 21/8234* (2006.01)
*H01L 29/78* (2006.01)
*H01L 27/088* (2006.01)
*H01L 29/423* (2006.01)

(52) U.S. Cl.
CPC ............ *H01L 29/42372* (2013.01); *H01L 21/823418* (2013.01); *H01L 21/823431* (2013.01); *H01L 27/0886* (2013.01); *H01L 29/785* (2013.01)

(58) Field of Classification Search
CPC ............ H01L 29/42372; H01L 29/785; H01L 21/823418; H01L 21/823431; H01L 21/823814; H01L 21/823821; H01L 27/0886; H01L 27/0924; H01L 27/092; H01L 21/76805; H01L 21/76831; H01L 21/823807; H01L 21/823871; H01L 21/823828; H01L 29/66545; H01L 20/0673; H01L 29/0847; H01L 29/42392; H01L 29/66439; H01L 29/165; H01L 29/41766; H01L 29/78696; H01L 29/775;
(Continued)

(56) References Cited

U.S. PATENT DOCUMENTS 9,209,247 B2 12/2015 Colinge et al.
9,236,267 B2 1/2016 De et al.
9,412,817 B2 8/2016 Yang et al.
(Continued)

FOREIGN PATENT DOCUMENTS

CN 109494251 * 3/2019 ....... H01L 20/42372
DE 1-2019 118 061 * 3/2020 ........... H01L 21/283
(Continued)

*Primary Examiner* — Mary A Wilczewski
(74) *Attorney, Agent, or Firm* — Slater Matsil, LLP

(57) ABSTRACT

A semiconductor device including source/drain contacts extending into source/drain regions, below topmost surfaces of the source/drain regions, and methods of forming the same are disclosed. In an embodiment, a semiconductor device includes a semiconductor substrate; a first channel region over the semiconductor substrate; a first gate stack over the semiconductor substrate and surrounding four sides of the first channel region; a first epitaxial source/drain region adjacent the first gate stack and the first channel region; and a first source/drain contact coupled to the first epitaxial source/drain region, a bottommost surface of the first source/drain contact extending below a topmost surface of the first channel region.

20 Claims, 43 Drawing Sheets

(58) Field of Classification Search
CPC ........... H01L 29/66636; H01L 29/7848; H01L 23/485; B82Y 10/00
See application file for complete search history.

(56) References Cited

U.S. PATENT DOCUMENTS

| | | | |
|---|---|---|---|
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 10,236,217 | B1 * | 3/2019 | Ando ................. H01L 21/8221 |
| 10,461,078 | B2 * | 10/2019 | Wen ................... H01L 29/4958 |
| 2016/0284700 | A1 | 9/2016 | Yoon et al. |
| 2017/0250184 | A1 | 8/2017 | Suk et al. |
| 2018/0083007 | A1 * | 3/2018 | Lee ................. H01L 21/823807 |
| 2019/0088542 | A1 | 3/2019 | Hsieh et al. |
| 2019/0131184 | A1 * | 5/2019 | Ando ................. H01L 27/0924 |
| 2019/0229021 | A1 * | 7/2019 | Ando ................. H01L 29/0673 |
| 2019/0267372 | A1 * | 8/2019 | Wen ................... H01L 21/28088 |
| 2020/0013898 | A1 * | 1/2020 | Yim ........................ B82Y 10/00 |
| 2020/0044028 | A1 * | 2/2020 | Reznicek ............ H01L 27/0688 |
| 2020/0091152 | A1 * | 3/2020 | Noh ............. H01L 21/823412 |
| 2020/0266271 | A1 * | 8/2020 | Lin ...................... H01L 27/0886 |
| 2021/0036106 | A1 * | 2/2021 | Shin ................... H01L 29/1037 |
| 2021/0036121 | A1 * | 2/2021 | Lim ................... H01L 29/78696 |
| 2021/0057411 | A1 * | 2/2021 | Kim ..................... H01L 27/092 |
| 2021/0104611 | A1 * | 4/2021 | Yu ....................... H01L 23/5226 |
| 2021/0257499 | A1 * | 8/2021 | Shin ................... H01L 29/0673 |
| 2021/0265349 | A1 * | 8/2021 | Chung ............. H01L 29/78696 |
| 2021/0336063 | A1 * | 10/2021 | Liao ....................... H01L 29/45 |
| 2021/0376101 | A1 * | 12/2021 | Wang ............. H01L 21/823431 |

FOREIGN PATENT DOCUMENTS

| | | |
|---|---|---|
| KR | 20160116103 A | 10/2016 |
| KR | 20170101344 A | 9/2017 |
| KR | 20180031855 A | 3/2018 |
| KR | 20180131346 A | 12/2018 |

* cited by examiner

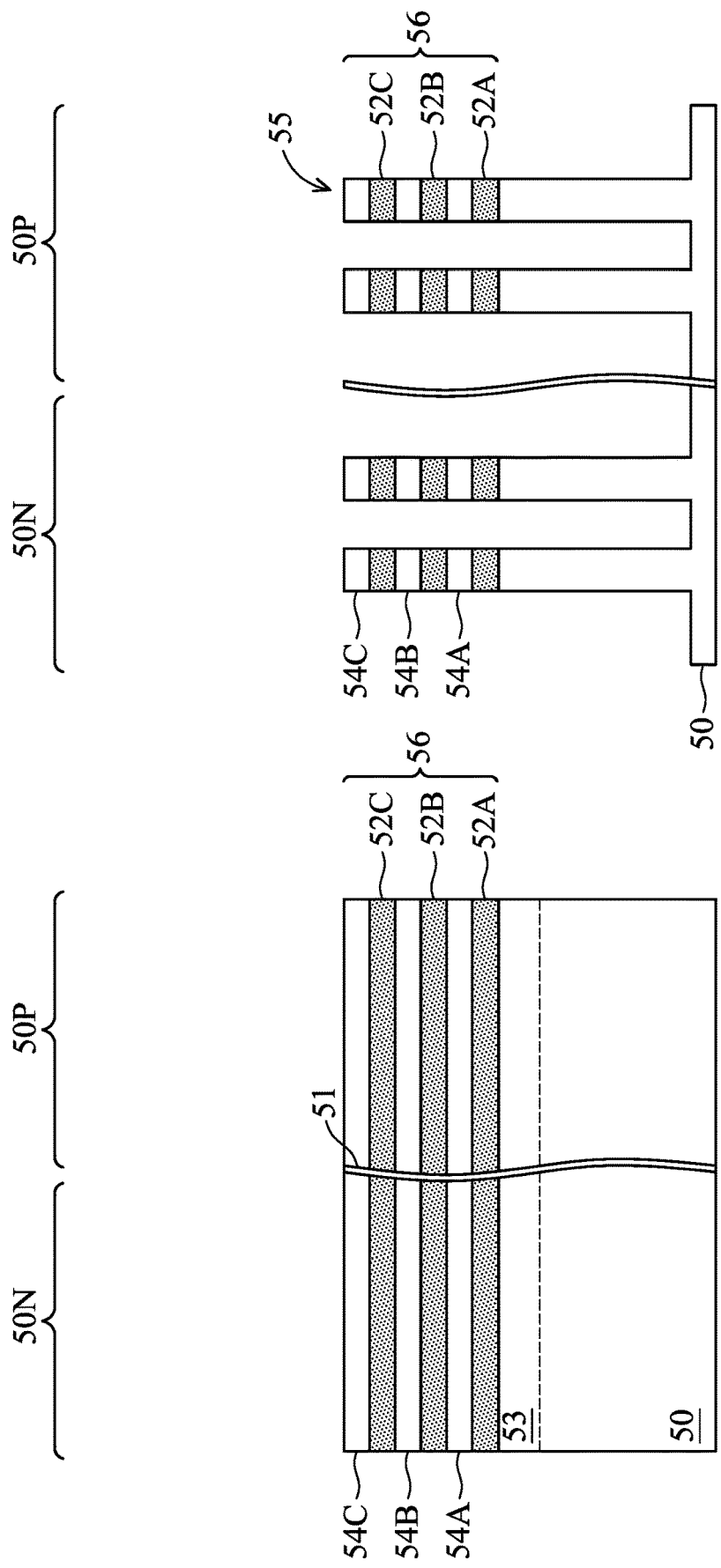

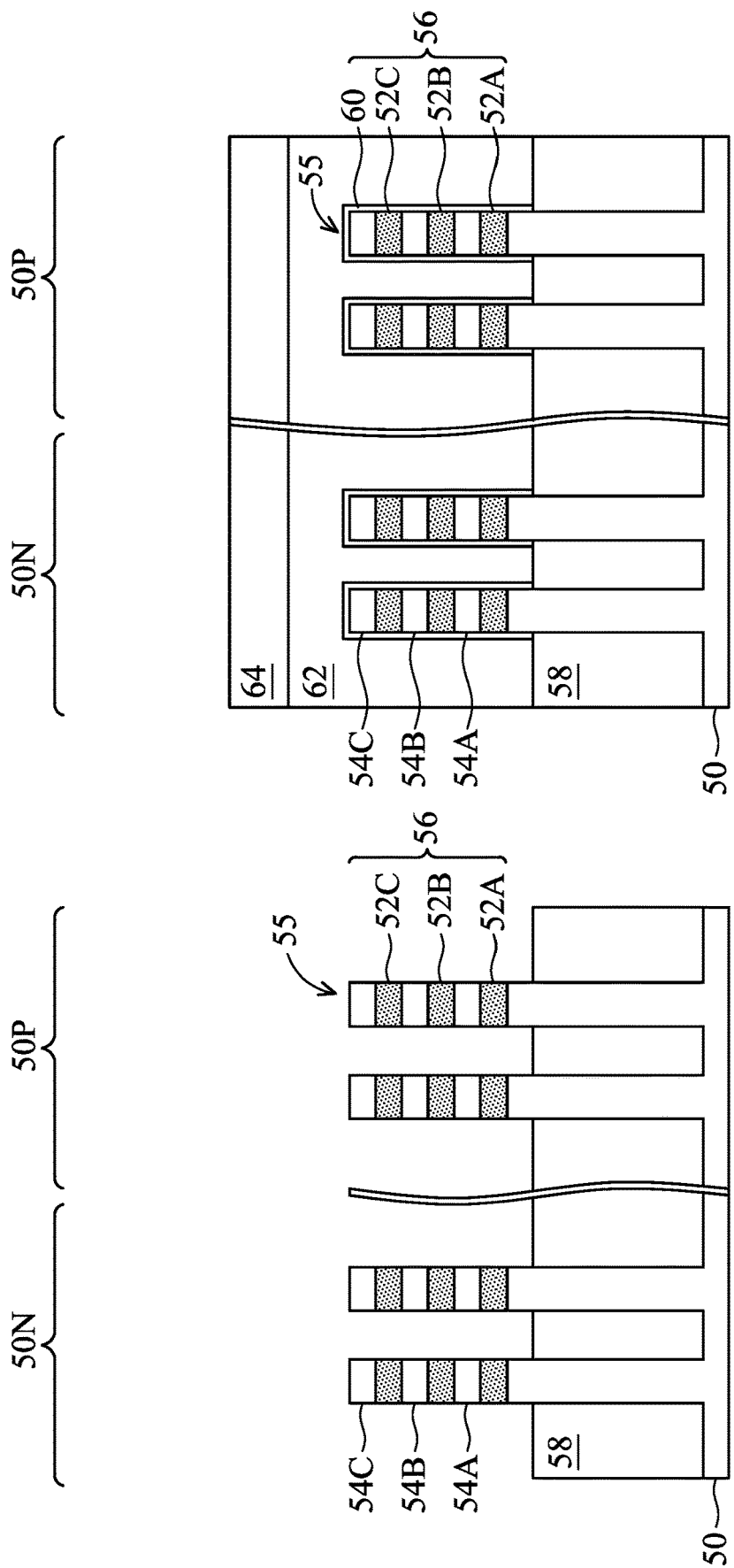

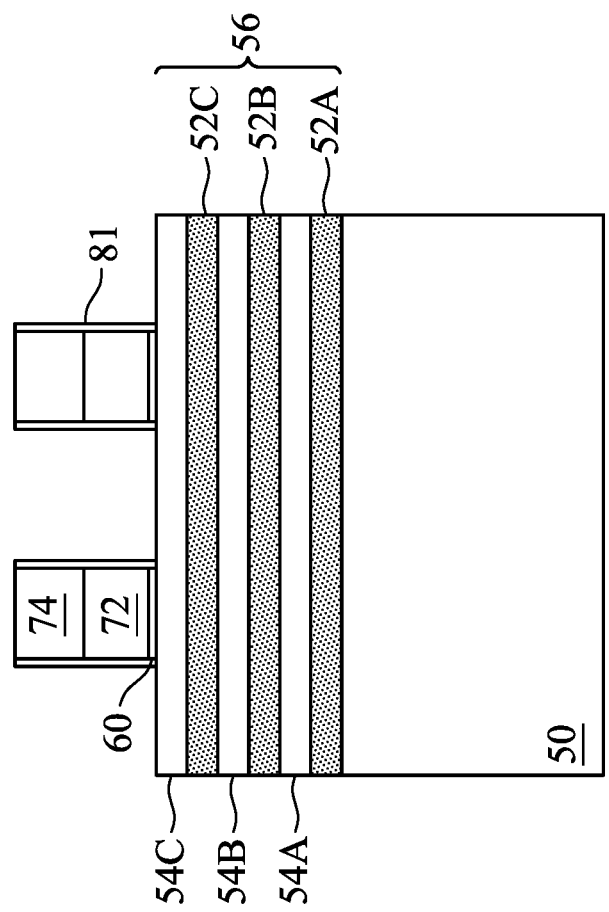
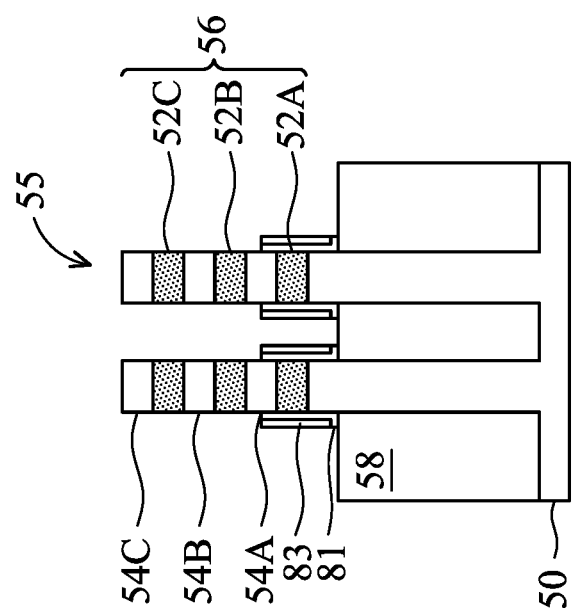
Figure 8A
Figure 8B

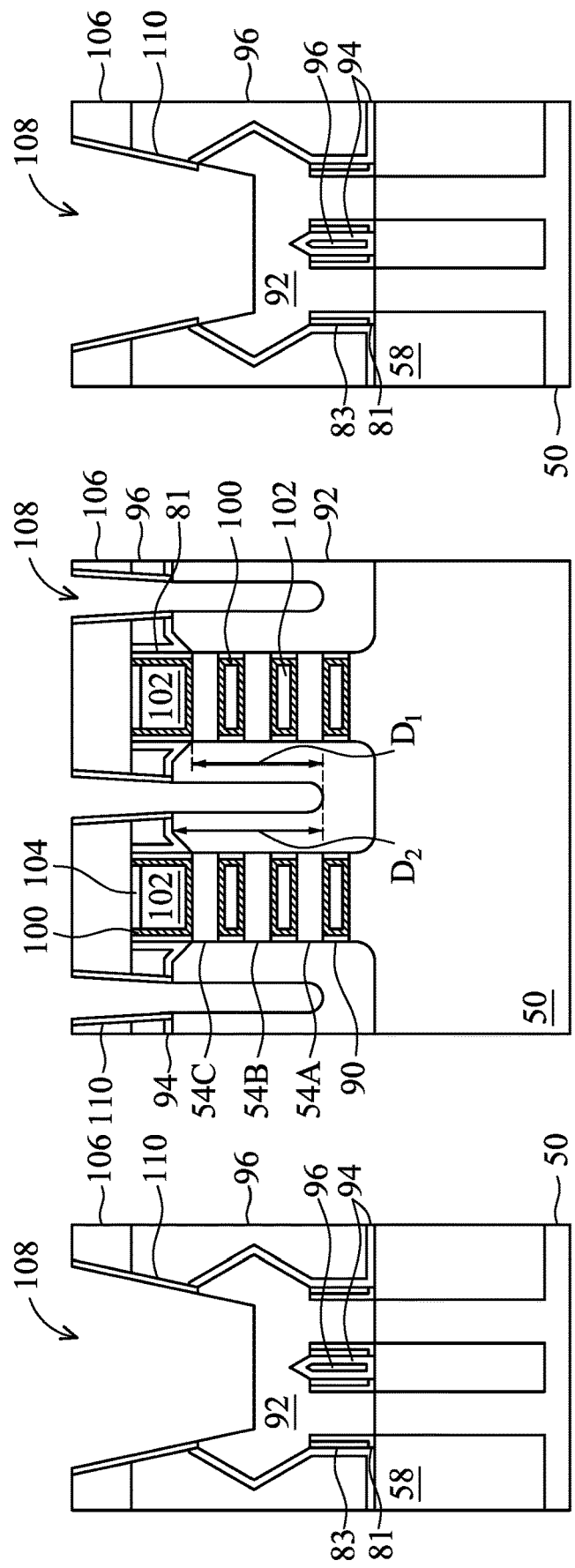

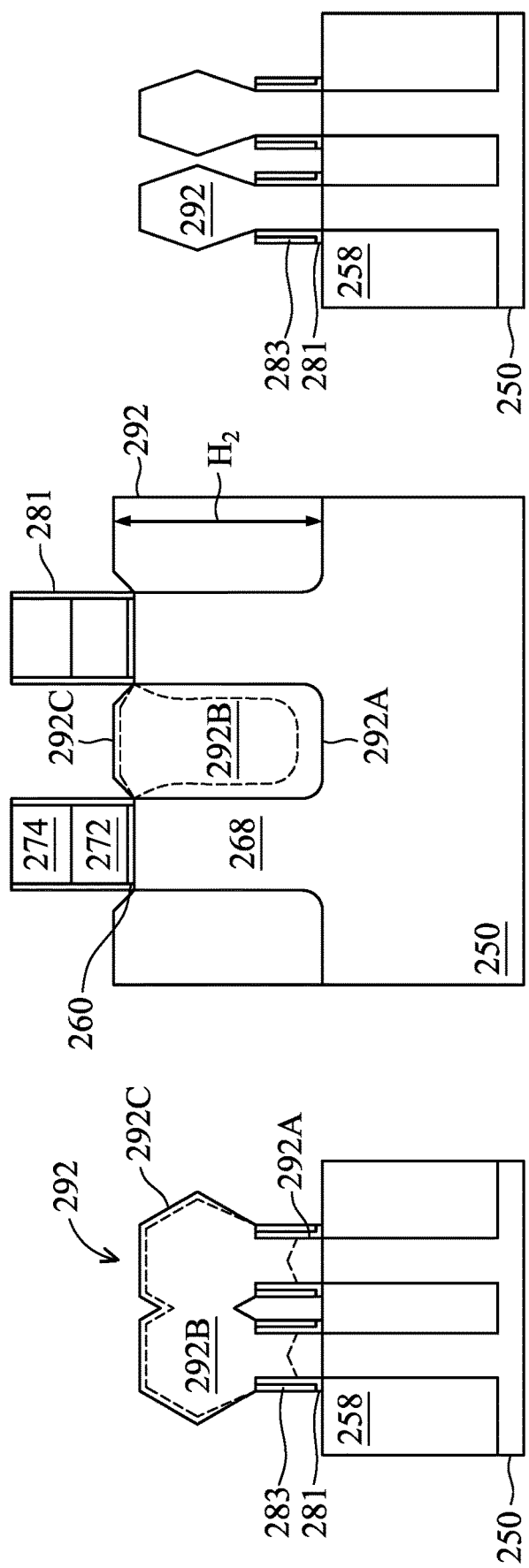

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 18A, 18B, 18C, 19A, 19B, 20A, 20B, 21A, 21B, 21C, 21D, 21E, 22A, 22B, 22C, 22D, 22E, 22F, 23A, and 23B are cross-sectional views of intermediate stages in the manufacturing of semiconductor devices, in accordance with some embodiments.

FIGS. 25, 26, 27, 28, 29A, 29B, 30A, 30B, 31A, 31B, 32A, 32B, 33A, 33B, 33C, 34A, 34B, 34C, 35A, 35B, 36A, 36B, 37A, 37B, 38A, 38B, 38C, 39A, 39B, 39C, 40A, 40B, 40C, 41A, and 41B are cross-sectional views of intermediate stages in the manufacturing of semiconductor devices, in accordance with some embodiments.

DETAILED DESCRIPTION

Figure 1:
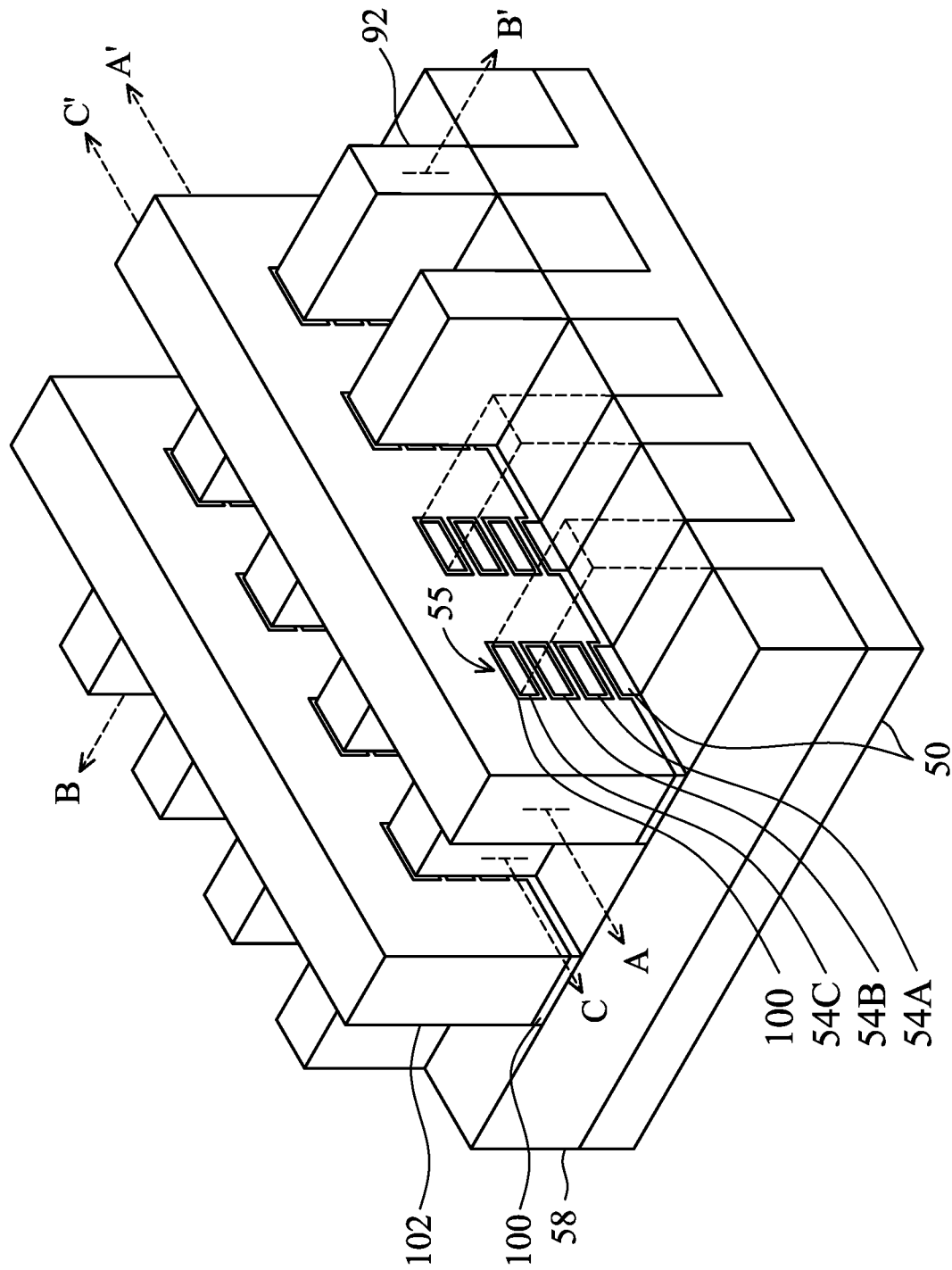
FIG. 1 illustrates an example of a semiconductor device including nanostructure field-effect transistors (NSFETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices and methods of forming the same in which source/drain contacts extend past top surfaces of and into epitaxial source/drain regions. In specific embodiments, first recesses may be formed through an interlayer dielectric to expose top surfaces of the epitaxial source/drain regions. A two-cycle plasma etching process may then be used to etch second recesses into the epitaxial source/drain regions to a depth greater than about 15 nm from top surfaces of adjacent channel regions. The first recesses and the second recesses may then be filled with a conductive material to form the source/drain contacts. Forming the source/drain contacts extending into the epitaxial source/drain regions may reduce the distance between the source/drain contacts and the channel regions of the semiconductor devices, which may lower source/drain contact resistance ($R_{csd}$) and improve electrical performance of the semiconductor devices.

FIG. 1 illustrates an example of nanostructure (e.g., nanosheet, nanowire, gate-all-around, or the like) field effect transistors (NSFETs), in accordance with some embodiments. The NSFETs comprise nanostructures 55 over a substrate 50 (e.g., a semiconductor substrate). The nanostructures 55 include second semiconductor layers 54A-54C, which act as channel regions of the nanostructures 55. Shallow trench isolation (STI) regions 58 are disposed in the substrate 50, and the nanostructures 55 are disposed above and between neighboring STI regions 58. Although the STI regions 58 are described/illustrated as being separate from the substrate 50, as used herein, the term "substrate" may refer to the semiconductor substrate alone or a combination of the semiconductor substrate and the STI regions.

Gate dielectric layers 100 are along top surfaces, sidewalls, and bottom surfaces of the nanostructures 55, such as on top surfaces, sidewalls, and bottom surfaces of each of the second semiconductor layers 54A-54C, and along top surfaces and sidewalls of portions of the substrate 50. Gate electrodes 102 are over the gate dielectric layers 100. Epitaxial source/drain regions 92 are disposed on opposite sides of the nanostructures 55, the gate dielectric layers 100, and the gate electrodes 102. FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of the NSFETs. Cross-section B-B' is perpendicular to cross-section A-A' and is along a longitudinal axis of a nanostructure 55 and in a direction of, for example, the current flow between the epitaxial source/drain regions 92 of the NSFETs. Cross-section C-C' is parallel to cross-section A-A' and extends through the epitaxial source/drain regions 92 of the NSFETs. Subsequent figures refer to these reference cross-sections for clarity.

Some embodiments discussed herein are discussed in the context of NSFETs and fin field effect transistors (FinFETs) formed using gate-last processes. In other embodiments, a gate-first process may be used. Also, some embodiments contemplate aspects used in planar devices, such as planar FETs.

FIGS. 2 through 23B are cross-sectional views of intermediate stages in the manufacturing of NSFETs, in accordance with some embodiments. FIGS. 2 through 5, 6A, 13A, 14A, 15A, 16A, 17A, 18A, 22A, and 23A illustrate reference cross-section A-A' illustrated in FIG. 1. FIGS. 6B, 7B, 8B, 9B, 10B, 11B, 11C, 12B, 12D, 13B, 14B, 15B, 16B, 17B, 18B, 19B, 20B, 21B, 21D, 21E, 22B, 22F, and 23B illustrate reference cross-section B-B' illustrated in FIG. 1. FIGS. 7A, 8A, 9A, 10A, 11A, 12A, 12C, 13C, 18C, 19A, 20A, 21A, 21C, 22C, 22D, and 22E illustrate reference cross-section C-C' illustrated in FIG. 1.

In FIG. 2, a substrate 50 is provided for forming NSFETs. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type NSFETs. The region 50P can be for forming p-type devices, such as PMOS transistors, e.g., p-type NSFETs. The region 50N may be physically separated from the region 50P (as illustrated by divider 51), and any number of device features (e.g., other active devices, doped regions, isolation structures, etc.) may be disposed between the region 50N and the region 50P.

The substrate 50 may be lightly doped with a p-type or an n-type impurity. An anti-punch-through (APT) implantation may be performed on an upper portion of the substrate 50 to form an APT region 53. During the APT implantation, dopants may be implanted in the region 50N and the region 50P. The dopants may have a conductivity type opposite a conductivity type of source/drain regions (such as the epitaxial source/drain regions 92, discussed below with respect to FIGS. 12A-12C) to be formed in each of the region 50N and the region 50P. The APT region 53 may extend under the subsequently formed source/drain regions in the resulting NSFETs, which will be formed in subsequent processes. The APT region 53 may be used to reduce the leakage from the source/drain regions to the substrate 50. In some embodiments, the doping concentration in APT region 53 may be from about $1\times10^{18}$ atoms/cm$^3$ to about $1\times10^{19}$ atoms/cm$^3$. For simplicity and legibility, the APT region 53 is not illustrated in subsequent drawings.

Further in FIG. 2, a multi-layer stack 56 is formed over the substrate 50. The multi-layer stack 56 includes alternating first semiconductor layers 52 and second semiconductor layers 54 of different semiconductor materials. The first semiconductor layers 52 may be formed of first semiconductor materials, which may include, for example, silicon germanium (SiGe) or the like. The second semiconductor layers 54 may be formed of second semiconductor materials, which may include, for example, silicon (Si), silicon carbon (SiC), or the like. In other embodiments, the first semiconductor layers 52 may be formed of the second semiconductor materials and the second semiconductor layers 54 may be formed of the first semiconductor materials. For purposes of illustration, the multi-layer stack 56 includes three of the first semiconductor layers 52 (e.g., first semiconductor layers 52A-52C) and three of the second semiconductor layers 54 (e.g., second semiconductor layers 54A-54C). In other embodiments, the multi-layer stack 56 may include any number of the first semiconductor layers 52 and the second semiconductor layers 54. Each of the layers of the multi-layer stack 56 may be epitaxially grown using a process such as chemical vapor deposition (CVD), atomic layer deposition (ALD), vapor phase epitaxy (VPE), molecular beam epitaxy (MBE), or the like.

For purposes of illustration, the second semiconductor layers 54 will be described as forming channel regions in completed NSFET devices. The first semiconductor layers 52 may be sacrificial layers, which may be subsequently removed. Nevertheless, in some embodiments the first semiconductor layers 52A-52C may form channel regions in completed NSFET devices, while the second semiconductor layers 54A-54C may be sacrificial layers.

In FIG. 3, nanostructures 55 are formed in the multi-layer stack 56 and the substrate 50 is etched. In some embodiments, the nanostructures 55 may be formed by etching trenches in the multi-layer stack 56 and the substrate 50. The etching may be any acceptable etch process, such as a reactive ion etch (RIE), neutral beam etch (NBE), the like, or a combination thereof. The etching may be anisotropic.

The nanostructures 55 and the substrate 50 may be patterned by any suitable method. For example, the nanostructures 55 and the substrate 50 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures 55 and the substrate 50. In some embodiments, a mask (or other layer) may remain on the nanostructures 55 after patterning the nanostructures 55 and the substrate 50.

In FIG. 4, shallow trench isolation (STI) regions 58 are formed adjacent the nanostructures 55 and the patterned portions of the substrate 50. The STI regions 58 may be formed by forming an insulation material (not separately illustrated) over the substrate 50 and between neighboring nanostructures 55/patterned portions of the substrate 50. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. The insulation material may comprise a single layer or may utilize multiple layers. For example, in some embodiments a liner (not separately illustrated) may first be formed along surfaces of the substrate 50 and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process may planarize the insulation material and the nanostructures 55. The planarization process exposes the nanostructures 55 such that top surfaces of the nanostructures 55 and the insulation material are level after the planarization process is complete.

The insulation material is then recessed to form the STI regions 58 as illustrated in FIG. 4. The insulation material is recessed such that upper portions of the nanostructures 55 and the substrate 50 protrude from between neighboring STI regions 58. Further, the top surfaces of the STI regions 58 may have flat surfaces as illustrated, convex surfaces, concave surfaces (such as dishing), or a combination thereof. The top surfaces of the STI regions 58 may be formed flat, convex, and/or concave by an appropriate etch. The STI regions 58 may be recessed using an acceptable etching process, such as one that is selective to the material of the insulation material (e.g., etches the material of the insulation material at a faster rate than the material of the nanostructures 55 and the substrate 50). For example, an oxide removal using, for example, dilute hydrofluoric (dHF) acid may be used.

The process described with respect to FIGS. 2-4 is just one example of how to form the nanostructures 55. In some embodiments, the nanostructures 55 may be formed by epitaxial growth processes. For example, dielectric layers may be formed over top surfaces of the substrate 50, and trenches may be etched through the dielectric layers to expose the underlying substrate 50. Epitaxial structures may be epitaxially grown in the trenches, and the dielectric layers may be recessed such that the epitaxial structures protrude from the dielectric layer to form the nanostructures 55. In the nanostructures 55, the epitaxial structures may comprise alternating layers of the first semiconductor materials and the second semiconductor materials. The substrate 50 may include epitaxial structures, which may be homoepitaxial structures or heteroepitaxial structures. The dielectric layers may be subsequently recessed such that the nanostructures 55 and portions of the substrate 50 protrude from the dielectric layer. In embodiments where the nanostructures 55 and portions of the substrate 50 are epitaxially grown, the epitaxially grown materials may be in situ doped during growth, which may obviate prior and subsequent implantations, although in situ and implantation doping may be used together.

Still further, it may be advantageous to epitaxially grow material in the region 50N (e.g., the NMOS region) different from the materials in the region 50P (e.g., the PMOS region). In various embodiments, upper portions of the substrate 50 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 4, appropriate wells (not separately illustrated) may be formed in the nanostructures 55 and/or the substrate 50. In some embodiments, P wells may be formed in the region 50N, and N wells may be formed in the region 50P. In further embodiments, P wells or N wells may be formed in each of the region 50N and the region 50P.

In embodiments including different well types, different implant steps for the region 50N and the region 50P may be achieved using a photoresist or other masks (not separately illustrated). For example, a photoresist may be formed over the nanostructures 55, the substrate 50, and the STI regions 58 in the region 50N. The photoresist is patterned to expose the region 50P of the substrate 50. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N. The n-type impurities may be phosphorus, arsenic, antimony, or the like implanted in the region to a concentration of equal to or less than $1 \times 10^{18}$ atoms/cm$^3$, such as from about $1 \times 10^{16}$ atoms/cm$^3$ to about $1 \times 10^{18}$ atoms/cm$^3$. After the implant, the photoresist is removed, such as by an acceptable ashing process.

Following the implanting of the region 50P, a photoresist is formed over the nanostructures 55, the substrate 50, and the STI regions 58 in the region 50P. The photoresist is patterned to expose the region 50N of the substrate 50. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P. The p-type impurities may be boron, boron fluoride, indium, or the like implanted in the region to a concentration of equal to or less than $1 \times 10^{18}$ atoms/cm$^3$, such as from about $1 \times 10^{16}$ atoms/cm$^3$ to about $1 \times 10^{18}$ atoms/cm$^3$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

In FIG. 5, dummy dielectric layers 60 are formed on the nanostructures 55 and the substrate 50. The dummy dielectric layers 60 may be, for example, silicon oxide, silicon nitride, a combination thereof, or the like, and may be deposited or thermally grown according to acceptable techniques. A dummy gate layer 62 is formed over the dummy dielectric layers 60, and a mask layer 64 is formed over the dummy gate layer 62. The dummy gate layer 62 may be deposited over the dummy dielectric layers 60 and then planarized by a process such as CMP. The mask layer 64 may be deposited over the dummy gate layer 62. The dummy gate layer 62 may be conductive or non-conductive materials and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the material of the STI regions 58. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layers 60 are shown covering only the nanostructures 55 and the substrate 50 for illustrative purposes only. In some embodiments, the dummy dielectric layers 60 may be deposited such that the dummy dielectric layers 60 cover the STI regions 58, extending between the dummy gate layer 62 and the STI regions 58.

FIGS. 6A through 23B illustrate various additional steps in the manufacturing of embodiment devices. FIGS. 6B through 23B illustrate features in either of the region 50N or the region 50P. For example, the structures illustrated in FIGS. 6B through 23B may be applicable to both the region 50N and the region 50P. Differences (if any) in the structures of the region 50N and the region 50P are described in the text accompanying each figure.

Figures 6A, 6B:
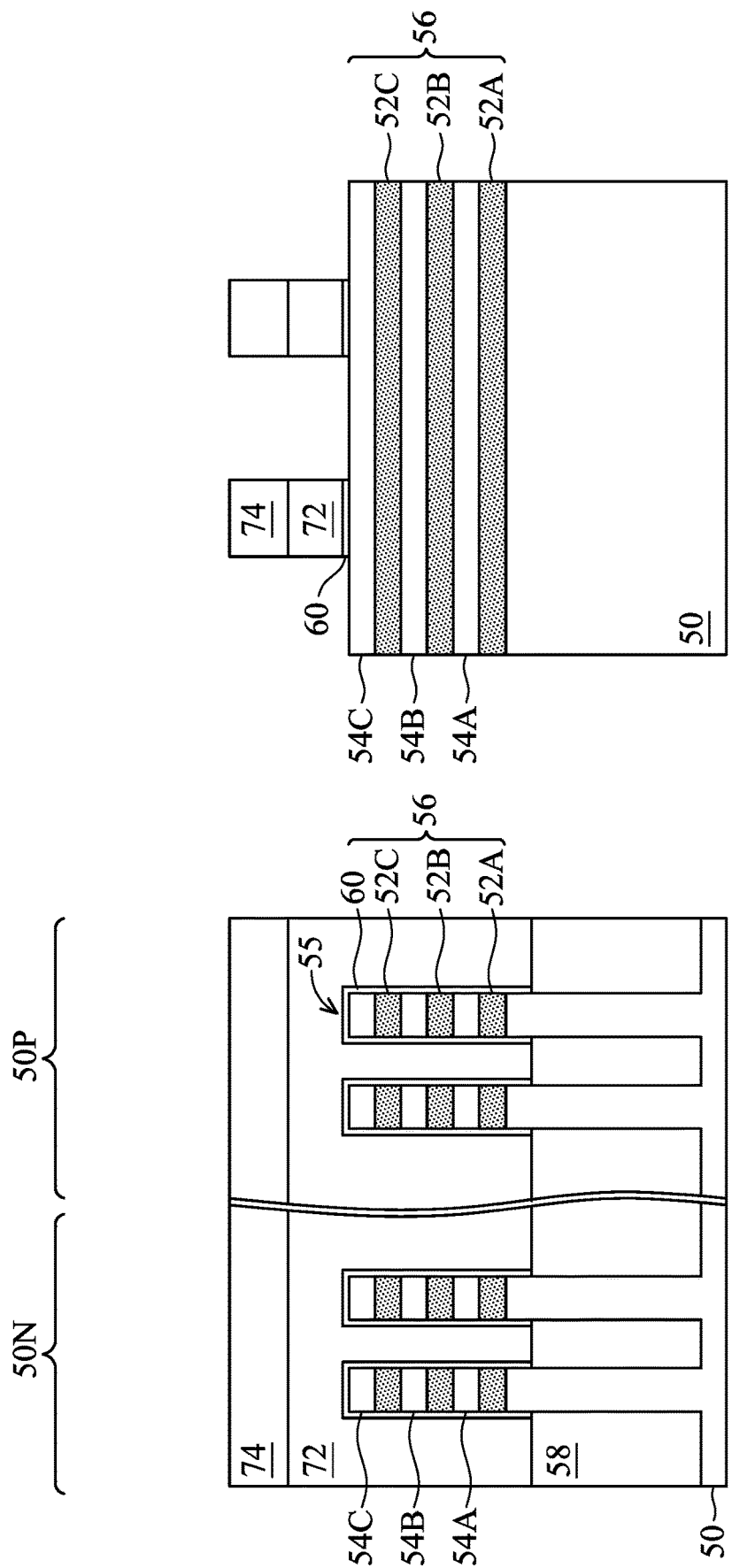

In FIGS. 6A and 6B, the mask layer 64 (see FIG. 5) may be patterned using acceptable photolithography and etching techniques to form masks 74. An acceptable etching technique may be used to transfer the pattern of the masks 74 to the dummy gate layer 62 to form dummy gates 72. In some embodiments, the pattern of the masks 74 may also be transferred to the dummy dielectric layers 60. The dummy gates 72 cover respective channel regions of the nanostructures 55. In an embodiment, the channel regions may be formed in the second semiconductor layers 54A-54C including the second semiconductor materials. The pattern of the masks 74 may be used to physically separate each of the dummy gates 72 from adjacent dummy gates 72. The dummy gates 72 may have a lengthwise direction substantially perpendicular to lengthwise directions of respective nanostructures 55.

Figure 7B:
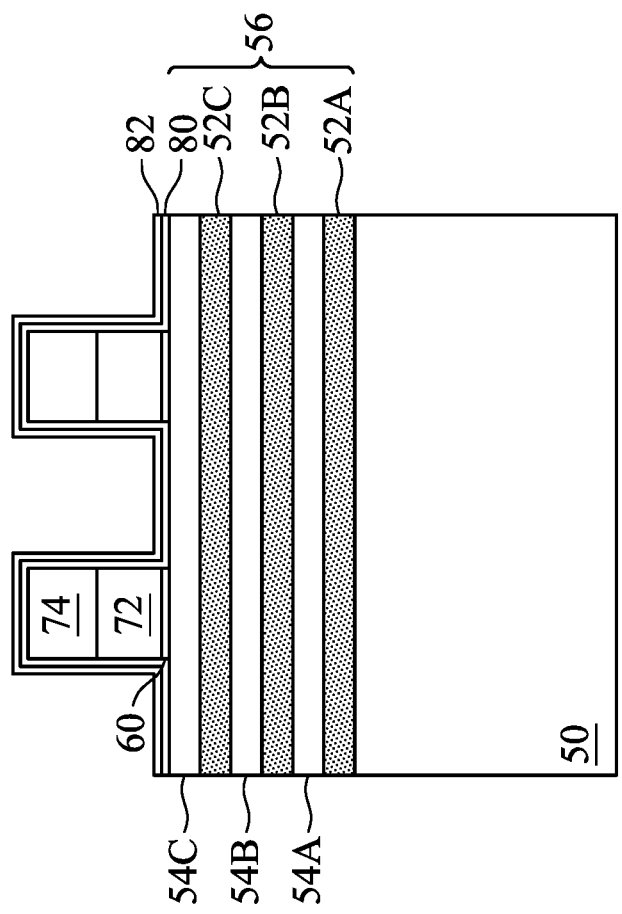
Figure 7A:
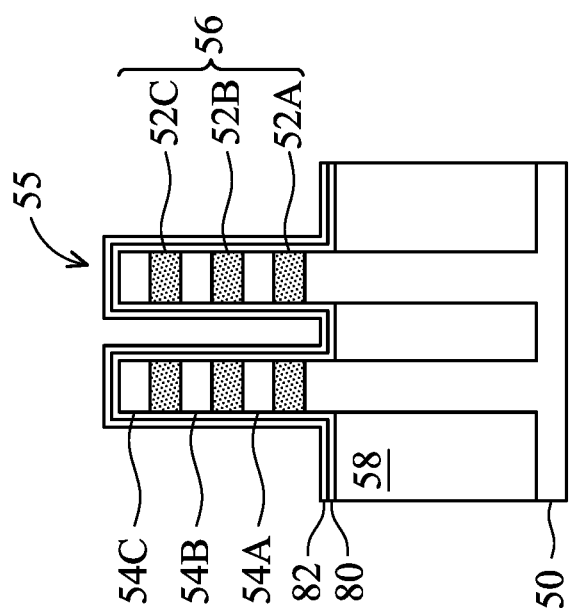

In FIGS. 7A and 7B, a first spacer layer 80 and a second spacer layer 82 are formed over the structures illustrated in FIGS. 6A and 6B. In FIGS. 7A and 7B, the first spacer layer 80 is formed on top surfaces of the STI regions 58, top surfaces and sidewalls of the nanostructures 55 and the masks 74, and sidewalls of the substrate 50, the dummy gates 72 and the dummy dielectric layers 60. The second spacer layer 82 is deposited over the first spacer layer 80. The first spacer layer 80 may be formed by thermal oxidation or deposited by CVD, ALD, or the like. The first spacer layer 80 may be formed of silicon oxide, silicon nitride, silicon oxynitride, or the like. The second spacer layer 82 may be deposited by CVD, ALD, or the like. The second spacer layer 82 may be formed of silicon oxide, silicon nitride, silicon oxynitride, or the like.

In FIGS. 8A and 8B, the first spacer layer 80 and the second spacer layer 82 are etched to form first spacers 81 and second spacers 83. The first spacer layer 80 and the second spacer layer 82 may be etched using a suitable etching process, such as an isotropic etching process (e.g., a wet etching process), an anisotropic etching process (e.g., a dry etching process), or the like. As illustrated in FIG. 8A, the first spacers 81 and the second spacers 83 are disposed on sidewalls of the nanostructures 55 and the substrate 50. As illustrated in FIG. 8B, the second spacer layer 82 may be removed from over the first spacer layer 80 adjacent the masks 74, the dummy gates 72, and the dummy dielectric layers 60 and the first spacers 81 are disposed on sidewalls of the masks 74, the dummy gates 72, and the dummy dielectric layers 60.

After the first spacers 81 and the second spacers 83 are formed, implants for lightly doped source/drain (LDD) regions (not separately illustrated) may be performed. In embodiments with different device types, similar to the implants discussed above in FIG. 4, a mask, such as a photoresist, may be formed over the region 50N, while exposing the region 50P, and appropriate type (e.g., p-type) impurities may be implanted into the exposed nanostructures 55 and the substrate 50 in the region 50P. The mask may then be removed. Subsequently, a mask, such as a photoresist, may be formed over the region 50P while exposing the region 50N, and appropriate type impurities (e.g., n-type) may be implanted into the exposed nanostructures 55 and the substrate 50 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $1\times10^{15}$ atoms/cm$^3$ to about $1\times10^{19}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacers 81 may be formed prior to forming the second spacers 83, additional spacers may be formed and removed, and/or the like. Furthermore, the n-type and p-type devices may be formed using a different structures and steps.

Figure 9B:
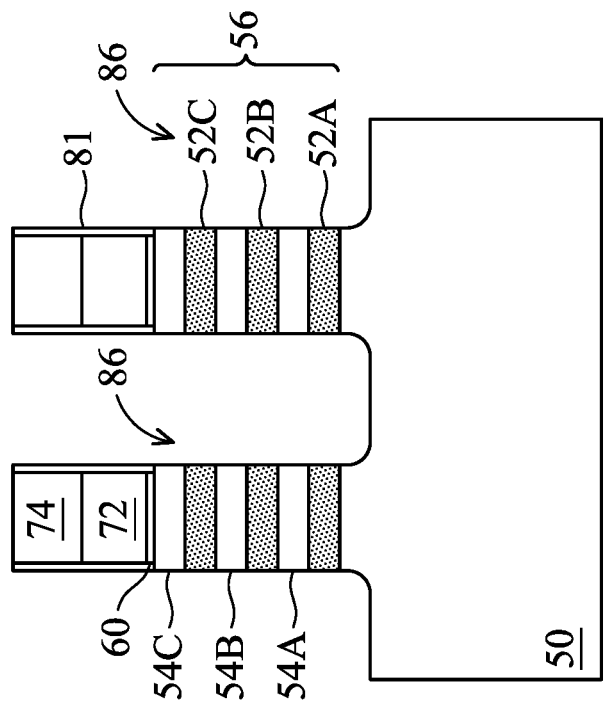
Figure 9A:
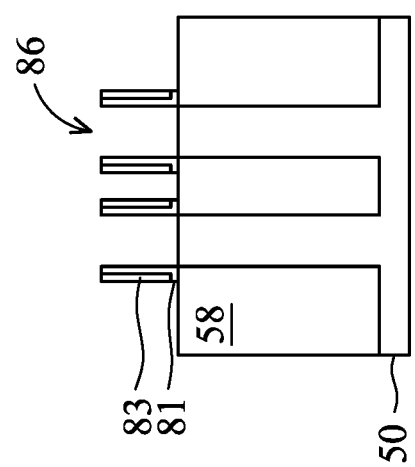

In FIGS. 9A and 9B, first recesses 86 are formed in the nanostructures 55 and the substrate 50. The first recesses 86 may extend through the first semiconductor layers 52A-52C and the second semiconductor layers 54A-54C, and into the substrate 50. As illustrated in FIG. 9A, top surfaces of the STI regions 58 may be level with top surfaces of the substrate 50. In various embodiments, the first recesses 86 may extend to a top surface of the substrate 50 without etching the substrate 50; the substrate 50 may be etched such that bottom surfaces of the first recesses 86 are disposed below the top surfaces of the STI regions 58; or the like. The first recesses 86 may be formed by etching the nanostructures 55 and the substrate 50 using anisotropic etching processes, such as RIE, NBE, or the like. The first spacers 81, the second spacers 83, and the masks 74 mask portions of the nanostructures 55 and the substrate 50 during the etching processes used to form the first recesses 86. A single etch process may be used to etch each layer of the multi-layer stack 56. In other embodiments, multiple etch processes may be used to etch the layers of the multi-layer stack 56. Timed etch processes may be used to stop the etching of the first recesses 86 after the first recesses 86 reach a desired depth.

Figure 10B:
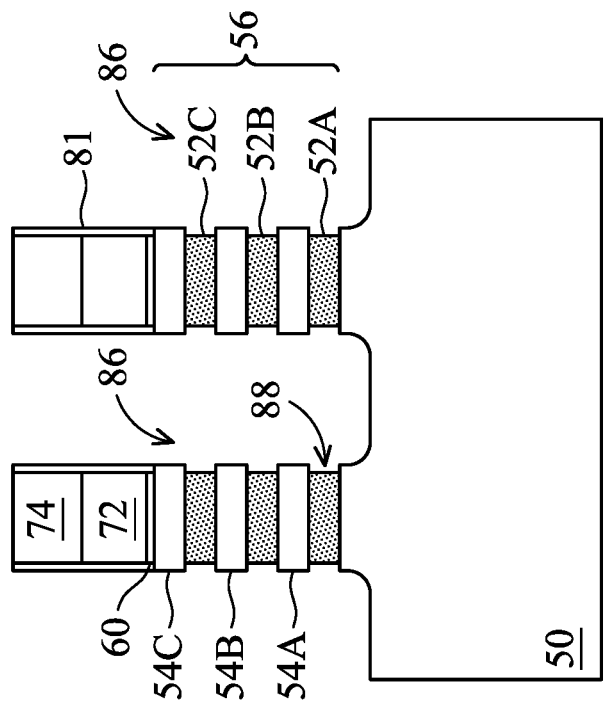
Figure 10A:
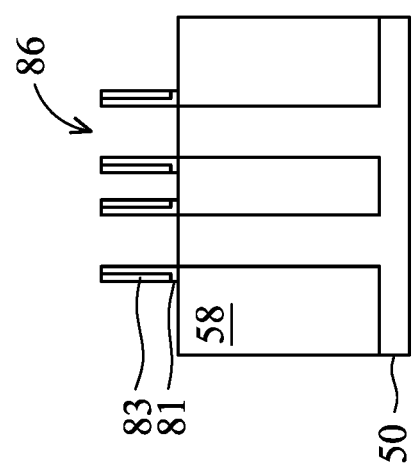

In FIGS. 10A and 10B, portions of sidewalls of the layers of the multi-layer stack 56 formed of the first semiconductor materials (e.g., the first semiconductor layers 52A-52C) exposed by the first recesses 86 are etched to form sidewall recesses 88. Although sidewalls of the first semiconductor layers 52A-52C are illustrated as being straight in FIG. 10B, the sidewalls may be concave or convex. The sidewalls may be etched using isotropic etching processes, such as wet etching or the like. The etchants used to etch the first semiconductor layers 52A-52C may be selective to the first semiconductor materials such that the second semiconductor layers 54A-54C and the substrate 50 remain relatively unetched as compared to the first semiconductor layers 52A-52C. In an embodiment in which the first semiconductor layers 52A-52C include, e.g., SiGe, and the second semiconductor layers 54A-54C include, e.g., Si or SiC, tetramethylammonium hydroxide (TMAH), ammonium hydroxide (NH$_4$OH), or the like may be used to etch sidewalls of the multi-layer stack 56. In further embodiments, the layers of the multi-layer stack 56 may be etched using a dry etching process. Hydrogen fluoride, another fluorine-based gas, or the like may be used to etch sidewalls of the multi-layer stack 56.

Figures 11A, 11B, 11C:
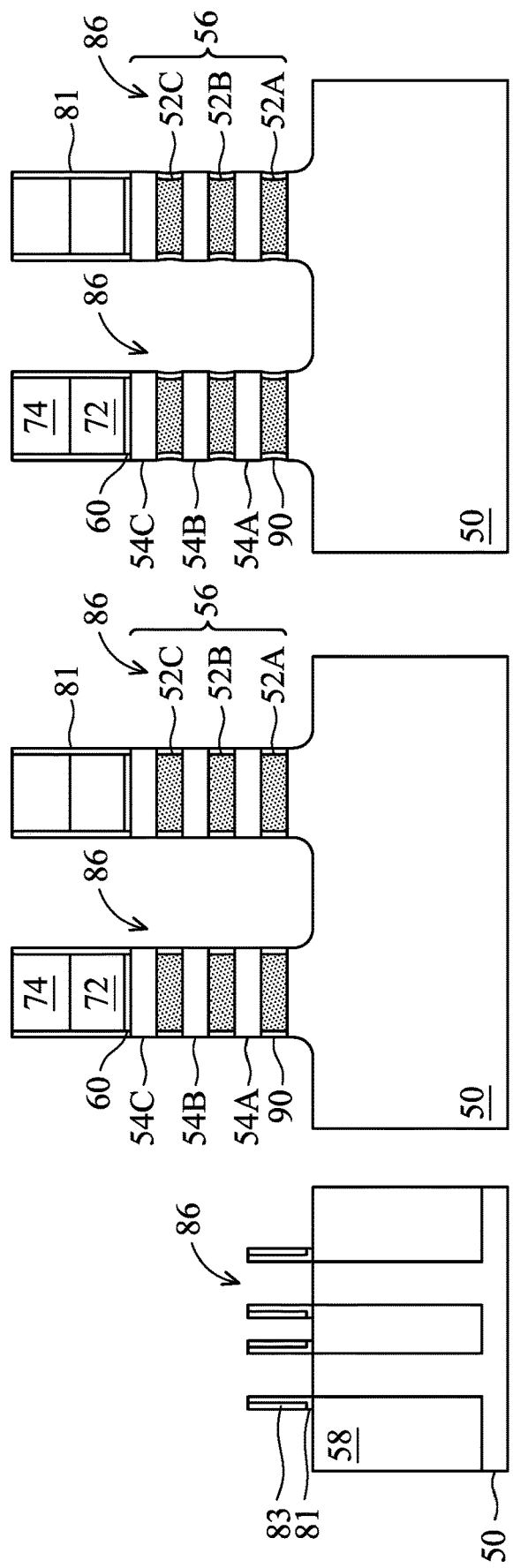

In FIGS. 11A-11C, first inner spacers 90 are formed in the sidewall recess 88. The first inner spacers 90 may be formed by depositing an inner spacer layer (not separately illustrated) over the structures illustrated in FIGS. 10A and 10B. The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be etched to form the first inner spacers 90. Although outer sidewalls of the first inner spacers 90 are illustrated as being flush with sidewalls of the second semiconductor layers 54A-54C in FIG. 11B, the outer sidewalls of the first inner spacers 90 may extend beyond or be recessed from sidewalls of the second semiconductor layers 54A-54C. Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first semiconductor layers 52A-52C are concave, outer sidewalls of the first inner spacers 90 are concave, and the first inner spacers 90 are recessed from sidewalls of the second semiconductor layers 54A-54C. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12C) by subsequent etching processes.

Figure 12B:
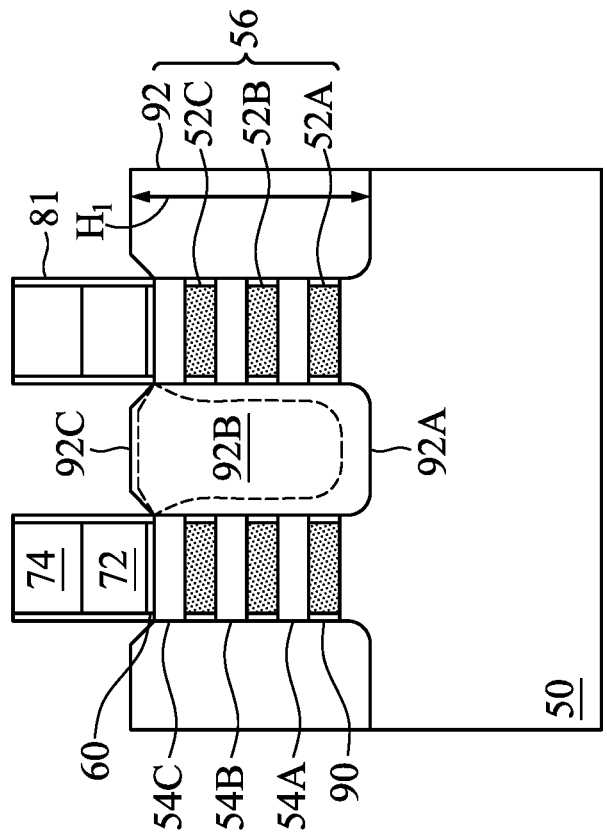
Figure 12A:
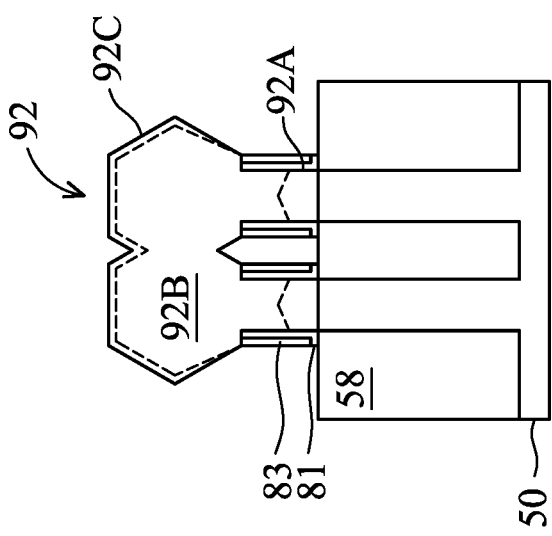
Figure 12D:
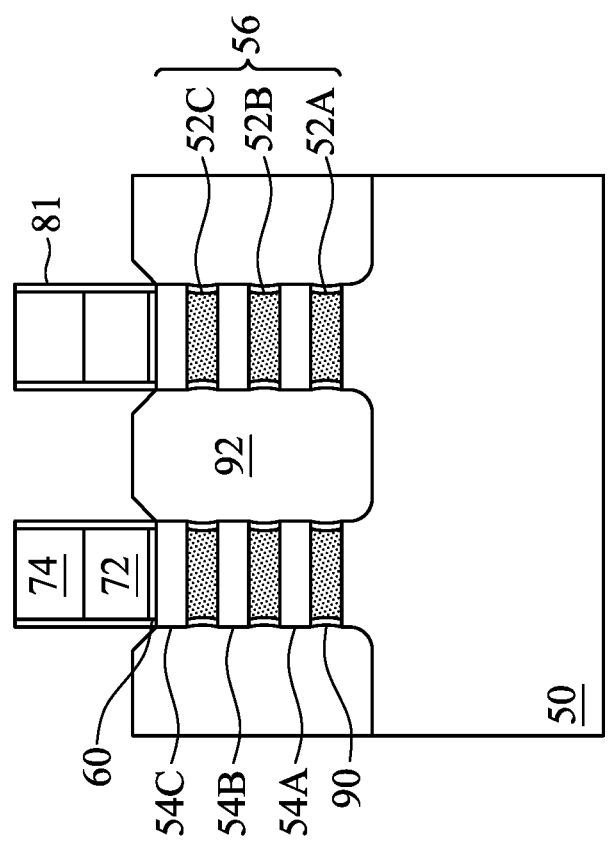
Figure 12C:
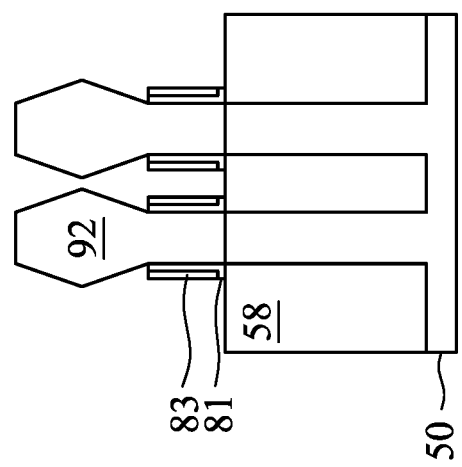

In FIGS. 12A-12C, epitaxial source/drain regions 92 are formed in the first recesses 86 to exert stress on the second semiconductor layers 54A-54C of the nanostructures 55, thereby improving performance. As illustrated in FIG. 12B, the epitaxial source/drain regions 92 are formed in the first recesses 86 such that each dummy gate 72 is disposed between respective neighboring pairs of the epitaxial source/drain regions 92. The epitaxial source/drain regions 92 may have heights H$_1$ from about 40 nm to about 60 nm, such as about 50 nm. In some embodiments, the first spacers 81 are used to separate the epitaxial source/drain regions 92 from the dummy gates 72 by an appropriate lateral distance so that the epitaxial source/drain regions 92 do not short out subsequently formed gates of the resulting NSFETs. The first inner spacers 90 may be used to separate the epitaxial source/drain regions 92 from the first semiconductor layers 52A-52C by appropriate lateral distances to prevent shorts between the epitaxial source/drain regions 92 and the subsequently formed gates of the resulting NSFETs.

The epitaxial source/drain regions 92 in the region 50N, e.g., the NMOS region, may be formed by masking the region 50P, e.g., the PMOS region. Then, the epitaxial source/drain regions 92 are epitaxially grown in the first recesses 86. The epitaxial source/drain regions 92 may include any acceptable material, such as appropriate for n-type NSFETs. For example, if the second semiconductor layers 54A-54C are silicon, the epitaxial source/drain regions 92 may include materials exerting a tensile strain on the second semiconductor layers 54A-54C, such as silicon, silicon carbide, phosphorous doped silicon carbide, silicon phosphide, or the like. The epitaxial source/drain regions 92 may have surfaces raised from respective surfaces of the multi-layer stack 56 and may have facets.

The epitaxial source/drain regions 92 in the region 50P, e.g., the PMOS region, may be formed by masking the region 50N, e.g., the NMOS region. Then, the epitaxial source/drain regions 92 are epitaxially grown in the first recesses 86. The epitaxial source/drain regions 92 may include any acceptable material, such as appropriate for p-type NSFETs. For example, if the second semiconductor layers 54A-54C are silicon, the epitaxial source/drain regions 92 may comprise materials exerting a compressive strain on the second semiconductor layers 54A-54C, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the second semiconductor layers 54A-54C, and/or the substrate 50 may be implanted with dopants to form source/drain regions, similar to the process previously discussed for forming lightly-doped source/drain regions, followed by an anneal. In some embodiments, the epitaxial source/drain regions 92 may be in situ doped with the dopants during growth. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed.

As a result of the epitaxy processes used to form the epitaxial source/drain regions 92 in the region 50N and the region 50P, upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed covering portions of the sidewalls of the nanostructures 55 and the substrate 50 that extend above the STI regions 58 thereby blocking the epitaxial growth. In some other embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

FIG. 12D illustrates an embodiment in which sidewalls of the first semiconductor layers 52A-52C are concave, outer sidewalls of the first inner spacers 90 are concave, and the first inner spacers are recessed from sidewalls of the second semiconductor layers 54A-54C. As illustrated in FIG. 12D, the epitaxial source/drain regions 92 may be formed in contact with the first inner spacers 90 and may extend past sidewalls of the second semiconductor layers 54A-54C.

Figures 13A, 13B, 13C:
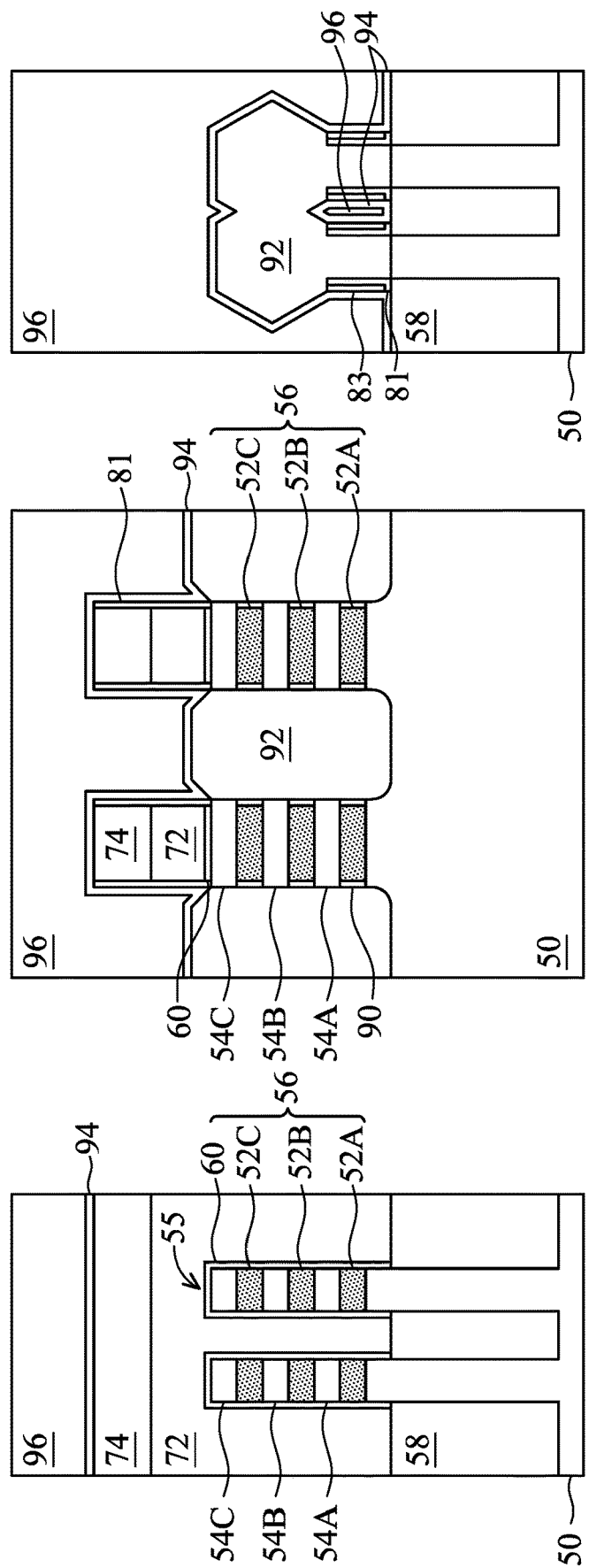

In FIGS. 13A-13C, a first interlayer dielectric (ILD) 96 is deposited over the structure illustrated in FIGS. 6A, 12B, and 12A (the processes of FIGS. 7A-12C do not alter the cross-section illustrated in FIG. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as, silicon nitride, silicon oxide, silicon oxynitride, or the like, having a different etch rate than the material of the overlying first ILD 96.

Figure 14B:
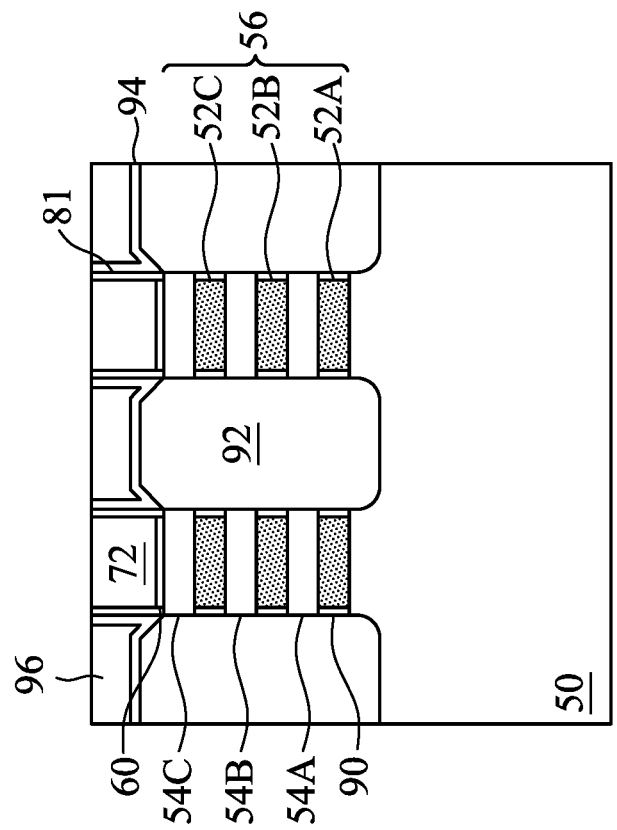
Figure 14A:
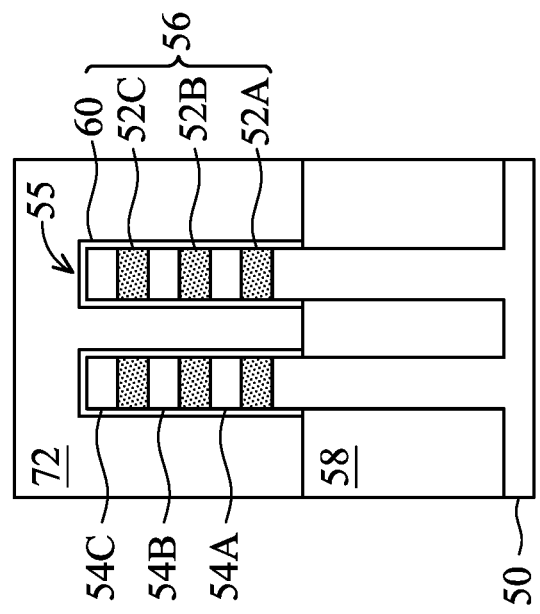

In FIGS. 14A-14C, a planarization process, such as a CMP, may be performed to level the top surface of the first ILD 96 with the top surfaces of the dummy gates 72 or the masks 74. The planarization process may also remove the masks 74 on the dummy gates 72, and portions of the first spacers 81 along sidewalls of the masks 74. After the planarization process, top surfaces of the dummy gates 72, the first spacers 81, and the first ILD 96 are level. Accordingly, the top surfaces of the dummy gates 72 are exposed through the first ILD 96. In some embodiments, the masks 74 may remain, in which case the planarization process levels the top surface of the first ILD 96 with top surface of the masks 74 and the first spacers 81.

Figure 15B:
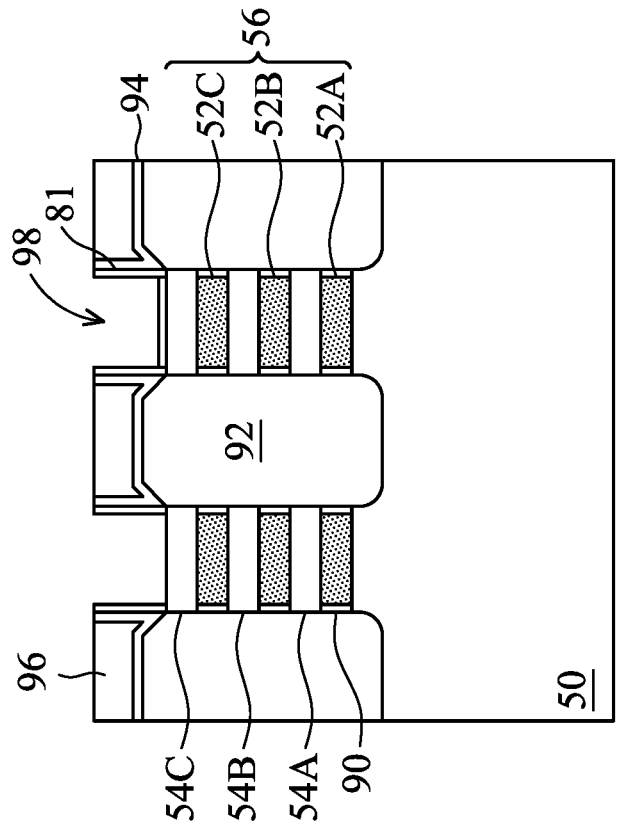
Figure 15A:
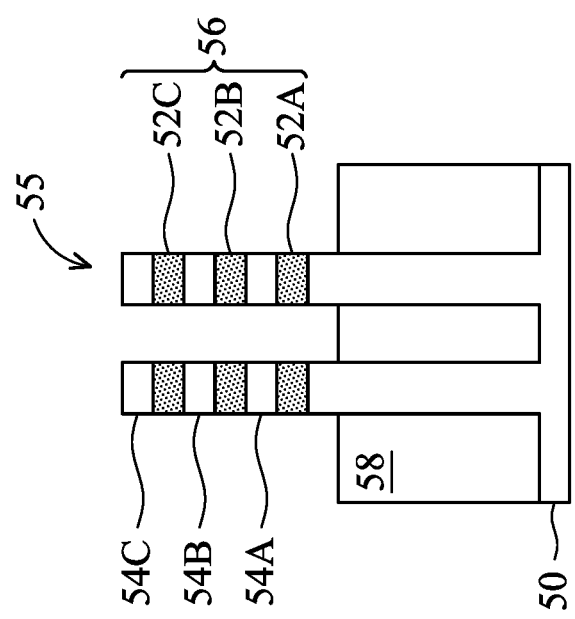

In FIGS. 15A and 15B, the dummy gates 72, and the masks 74 if present, are removed in an etching step(s), so that second recesses 98 are formed. Portions of the dummy dielectric layers 60 in the second recesses 98 may also be removed. In some embodiments, only the dummy gates 72 are removed and the dummy dielectric layers 60 remain and are exposed by the second recesses 98. In some embodiments, the dummy dielectric layers 60 are removed from second recesses 98 in a first region of a die (e.g., a core logic region) and remain in second recesses 98 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 at a faster rate than the first ILD 96 or the first spacers 81. Each second recess 98 exposes and/or overlies portions of the multi-layer stack 56, which act as channel regions in subsequently completed NSFETs. Portions of the multi-layer stack 56 which act as the channel regions are disposed between neighboring pairs of the epitaxial source/drain regions 92. During the removal, the dummy dielectric layers 60 may be used as etch stop layers when the dummy gates 72 are etched. The dummy dielectric layers 60 may then be optionally removed after the removal of the dummy gates 72.

Figure 16B:
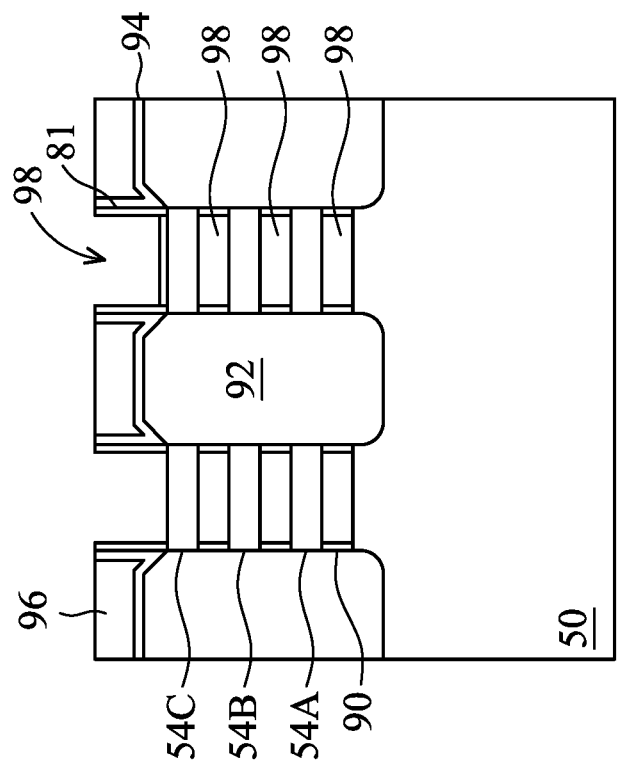
Figure 16A:
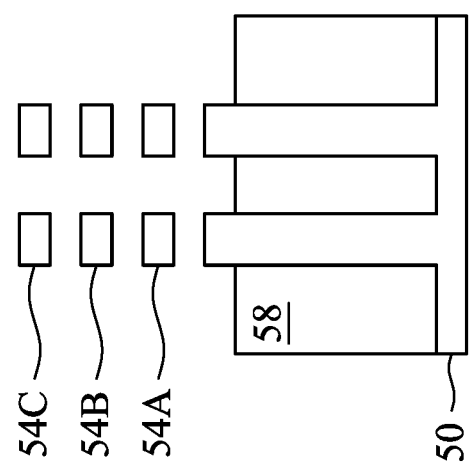

In FIGS. 16A and 16B, the first semiconductor layers 52A-52C are removed extending the second recesses 98. The first semiconductor layers 52A-52C may be removed by an isotropic etching process such as wet etching or the like. The first semiconductor layers 52A-52C may be removed using etchants which are selective to the materials of the first semiconductor layers 52A-52C, while the second semiconductor layers 54A-54C, the substrate 50, the STI regions 58 remain relatively unetched as compared to the first semiconductor layers 52A-52C. In an embodiment in which the first semiconductor layers 52A-52C include, e.g., SiGe, and the second semiconductor layers 54A-54C include, e.g., Si or SiC, tetramethylammonium hydroxide (TMAH), ammonium hydroxide ($NH_4OH$), or the like may be used to remove the first semiconductor layers 52A-52C.

Figure 17B:
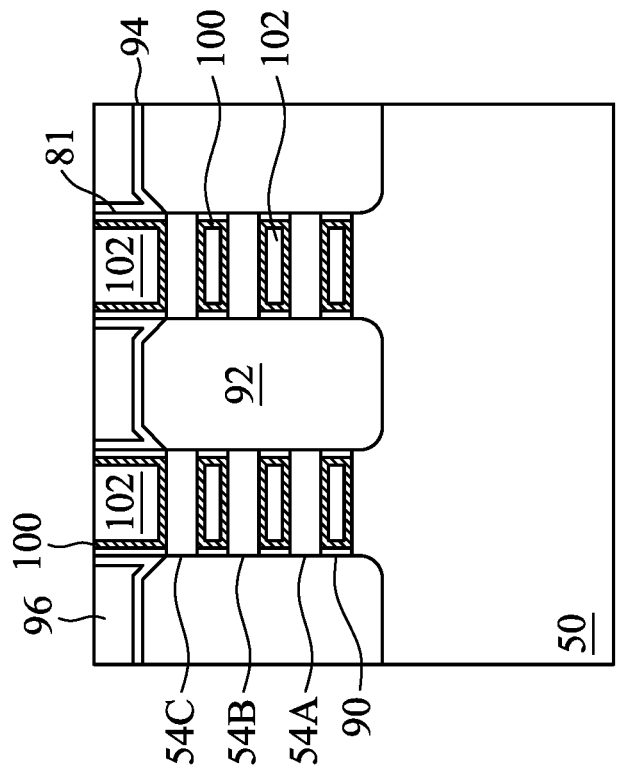
Figure 17A:
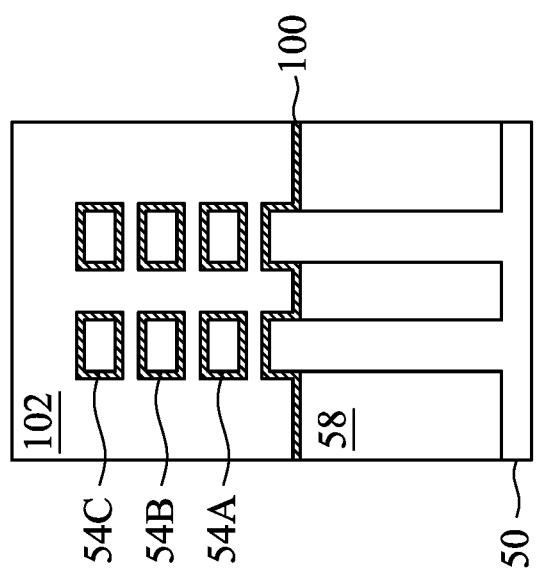

In FIGS. 17A and 17B, gate dielectric layers 100 and gate electrodes 102 are formed for replacement gates. The gate dielectric layers 100 are deposited conformally in the second recesses 98, such as on top surfaces and sidewalls of the substrate 50 and on top surfaces, sidewalls, and bottom surfaces of the second semiconductor layers 54A-54C. The gate dielectric layers 100 may also be deposited on top surfaces of the first ILD 96, the CESL 94, the first spacers 81, and the STI regions 58. In accordance with some embodiments, the gate dielectric layers 100 comprise silicon oxide, silicon nitride, or multilayers thereof. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17B, the gate electrodes 102 may comprise any number of liner layers, any number of work function tuning layers, and a fill material. Any combination of the layers which make up the gate electrodes 102 may be deposited in the areas between each of the second semiconductor layers 54A-54C and between the second semiconductor layer 54A and the substrate 50. After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gates of the resulting NSFETs. The gate electrodes 102 and the gate dielectric layers 100 may be collectively referred to as "gate stacks."

The formation of the gate dielectric layers 100 in the region 50N and the region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials, and/or the gate electrodes 102 in each region may be formed by distinct processes, such that the gate electrodes 102 may be different materials. Various masking steps may be used to mask and expose appropriate regions when using distinct processes.

Figures 18A, 18B, 18C:
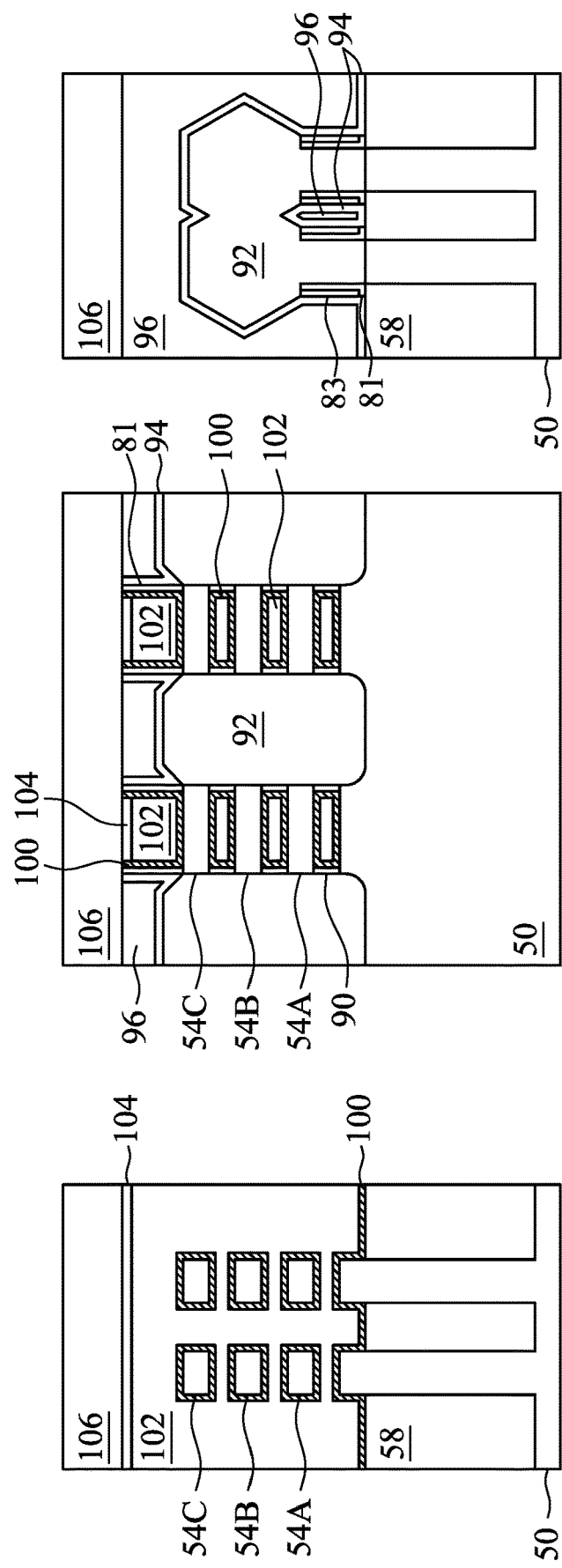

In FIGS. 18A-18C, a second ILD 106 is deposited over the first ILD 96. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like. In accordance with some embodiments, before the formation of the second ILD 106, the gate stack (including the gate dielectric layers 100 and the corresponding overlying gate electrodes 102) is recessed, so that a recess is formed directly over the gate stack and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 23A and 23B) penetrate through the gate mask 104 to contact the top surface of the recessed gate electrodes 102.

Figure 19B:
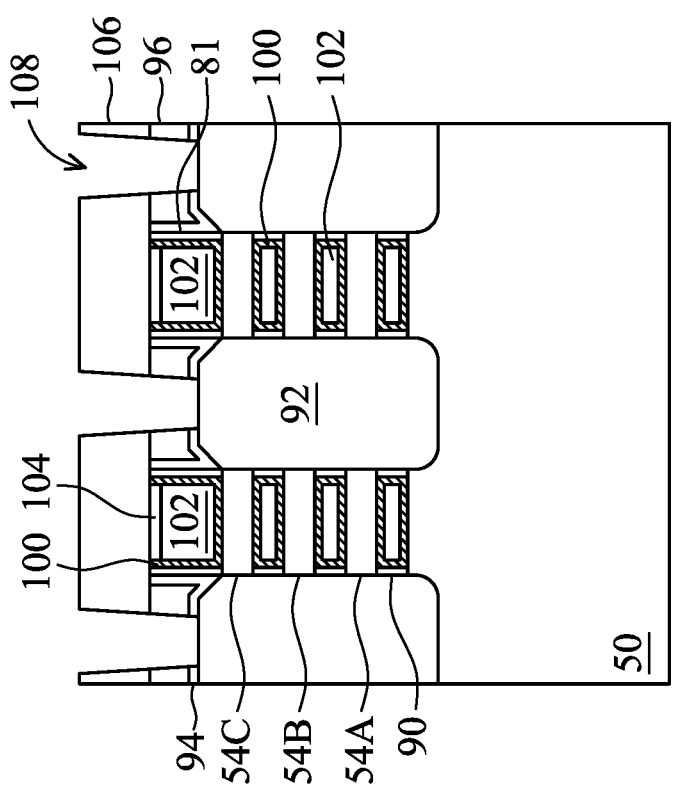
Figure 19A:
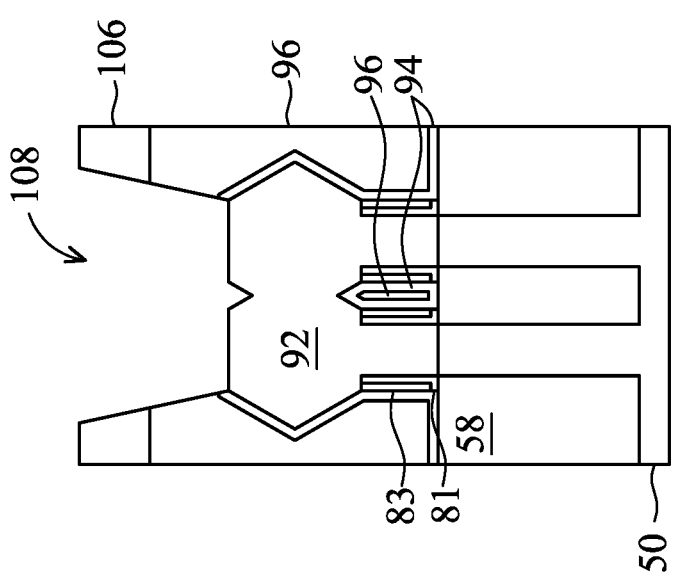

In FIGS. 19A and 19B, the second ILD 106, the first ILD 96, and the CESL 94 are etched to form third recesses 108 exposing surfaces of the epitaxial source/drain regions 92. The third recesses 108 may be formed by etching using an anisotropic etching process, such as RIE, NBE, or the like. In some embodiments, the third recesses 108 may be etched through the second ILD 106 and the first ILD 96 using a first etching process and may then be etched through the CESL 94 using a second etching process. A mask, such as a photoresist, may be formed and patterned over the second ILD 106 to mask portions of the second ILD 106 from the first etching process and the second etching process.

Figure 20B:
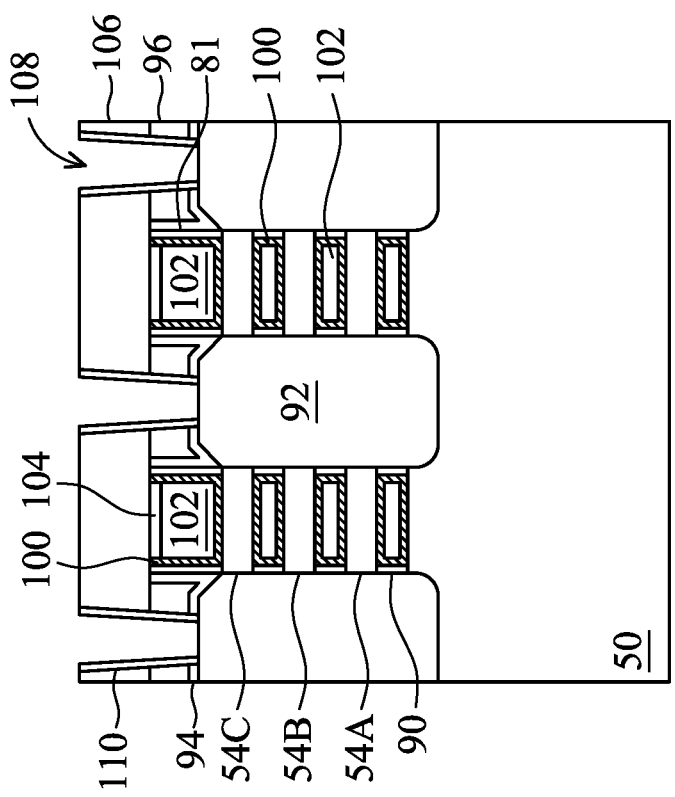
Figure 20A:
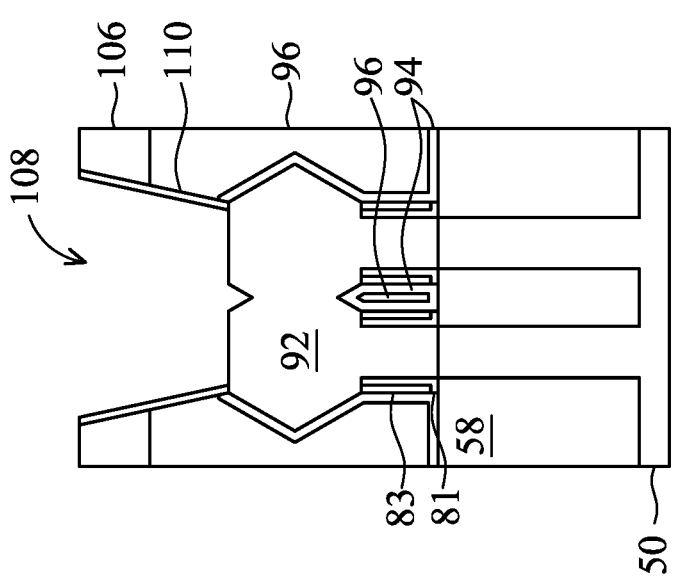

In FIGS. 20A and 20B, third spacers 110 are formed on sidewalls of the third recesses 108. A third spacer layer (not separately illustrated) may be formed on top surfaces of the second ILD 106 and the epitaxial source/drain regions 92 and on sidewalls of the second ILD 106, the first ILD 96, and the CESL 94. The third spacer layer may be formed by thermal oxidation or deposited by CVD, ALD, or the like. The third spacer layer may be formed of silicon oxide, silicon nitride, silicon oxynitride, or the like. The third spacer layer may be etched using a suitable etching process such as anisotropic etching (e.g., a dry etch process) or the like to form the third spacers 110. As illustrated in FIGS. 20A and 20B, the third spacers 110 may remain on sidewalls of the second ILD 106, the first ILD 96, and the CESL 94 in the third recesses 108. The third spacers 110 may have thicknesses from about 2 nm to about 5 nm, such as about 3 nm and may be used to protect sidewalls of the second ILD 106, the first ILD 96, and the CESL 94 from etching subsequently performed on the epitaxial source/drain regions 92. In some embodiments, the third spacers 110 may be formed of silicon nitride and may be used to prevent leakage from subsequently formed source/drain contacts (such as the source/drain contacts 112, discussed below with respect to FIGS. 22A-22F), and may be used to improve breakdown voltage ($V_{bd}$) reliability issues, thereby increasing performance and decreasing device defects.

Figure 21E:
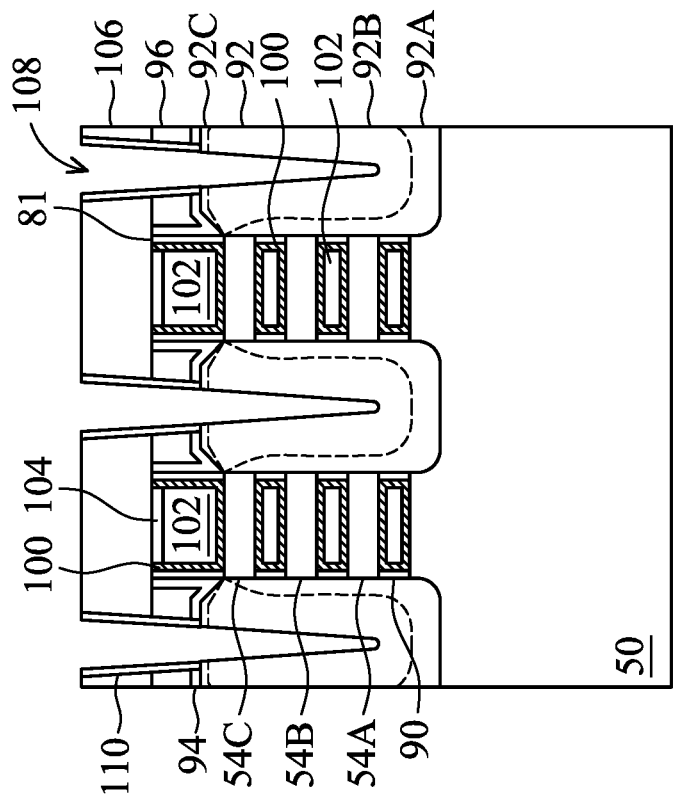
Figure 21D:
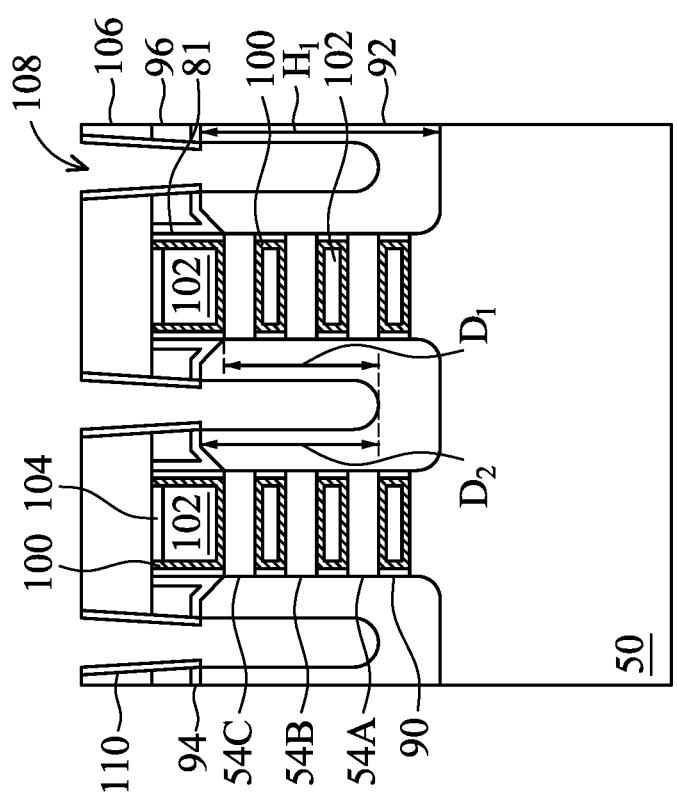

In FIGS. 21A-21E, the epitaxial source/drain regions 92 are etched to extend the third recesses 108. The epitaxial source/drain regions 92 may be etched by an anisotropic etching process such as RIE, NBE, or the like. The epitaxial source/drain regions 92 may be etched by an iterative etching process in which each iteration includes a third etching process followed by a fourth etching process. The third etching process and the fourth etching process may be different from the first etching process and the second etching process used to etch the first ILD 96, the second ILD 106, and the CESL 94. The iterative etching process may be repeated for from 5 iterations to 20 iterations, such as 10 iterations. The iterative etching process may be repeated until a depth $D_1$ of the third recesses 108 below top surfaces of the second semiconductor layers 54C is greater than about 15 nm or from about 10 nm to about 20 nm, such as about 15 nm. A depth $D_2$ of the third recesses 108 below top surfaces of the epitaxial source/drain regions 92 may be greater than about 18 nm or from about 13 nm to about 23 nm, such as about 18 nm. A ratio of the depth $D_2$ of the third recesses 108 to the height $H_1$ of the epitaxial source/drain regions 92 may be from about 1:3 to about 1:2, such as about 2:5. Bottommost surfaces of the third recesses 108 may be disposed above, below, or level with bottommost surfaces of the second semiconductor layers 54A. Portions of the gate dielectric layers 100 and the gate electrodes 102 may extend below the bottommost surfaces of the third recesses 108. For example, as illustrated in FIGS. 21B, 21D, and 21E, portions of the gate dielectric layers 100 and the gate electrodes 102 formed between the substrate 50 and the second semiconductor layers 54A may extend below the bottommost surfaces of the third recesses 108. In some embodiments, portions of the gate dielectric layers 100 and the gate electrodes 102 formed between the second semiconductor layers 54A and the second semiconductor layers 54B may extend below the bottommost surfaces of the third recesses 108. Etching the third recesses 108 to the depths described reduces the distance between subsequently formed source/drain contacts (such as source/drain contacts 112, discussed below in reference to FIGS. 22B-22F) and the second semiconductor layers 54A-54C, which reduces source/drain contact resistance ($R_{csd}$) and improves device performance of NSFETs. Etching the third recesses 108 to too great of depths may impact the performance of the epitaxial source/drain regions 92, reducing device performance and causing device defects. As illustrated in FIGS. 21A and 21B, sidewalls of the epitaxial source/drain regions 92 may be contiguous with sidewalls of the third spacers 110. In other embodiments, as illustrated in FIGS. 21C and 21D, the third recesses 108 may undercut the epitaxial source/drain regions 92 under the third spacers 110.

FIG. 21E illustrates a profile of the third recesses 108, in accordance with some embodiments. As shown in the embodiment illustrated in FIG. 21E, sidewalls of the epitaxial source/drain regions 92 adjacent the third recesses 108 may be contiguous with sidewalls of the third spacers 110. Portions of the sidewalls of the epitaxial source/drain regions 92 adjacent the third recesses 108 may be substantially straight and may be inclined to a rounded point. As further illustrated in FIG. 21E, the third recesses 108 may extend through the third semiconductor material layer 92C and partially through the second semiconductor material layer 92B. However, in some embodiments, the third recesses 108 may extend partially through the third semiconductor material layer 92C; through the third semiconductor material layer 92C, through the second semiconductor material layer 92B, and partially through the first semiconductor material layer 92A; or the like.

The third etching process may use a third etchant gas and a fourth etchant gas. The third etchant gas may include fluoromethane ($CH_3F$), difluoromethane ($CH_2F_2$), or the like and the fourth etchant gas may include hydrogen ($H_2$) or the like. A flow rate of the third etchant gas may be from about 10 sccm to about 40 sccm, such as about 15 sccm and a flow rate of the fourth etchant gas may be from about 150 sccm to about 300 sccm, such as about 200 sccm. The third etching process may be performed at a pressure from about 10 mTorr to about 30 mTorr, such as about 15 mTorr and a temperature from about 30° C. to about 60° C., such as about 40° C. A plasma may be generated from the third etchant gas and the fourth etchant gas using a plasma generator at a power from about 100 W to about 300 W, such as about 200 W. A substrate holder on which the substrate 50 is disposed during the third etching process may be biased with a voltage from about 200 V to about 400 V, such as about 300 V.

The fourth etching process may use a fifth etchant gas and a sixth etchant gas. The fifth etchant gas may include nitrogen ($N_2$), argon (Ar), or the like and the sixth etchant gas may include hydrogen ($H_2$) or the like. A flow rate of the fifth etchant gas may be from about 100 sccm to about 300 sccm, such as about 150 sccm and a flow rate of the sixth etchant gas may be from about 150 sccm to about 300 sccm, such as about 200 sccm. The fourth etching process may be performed at a pressure from about 10 mTorr to about 30 mTorr, such as about 15 mTorr and a temperature from about 30° C. to about 60° C., such as about 40° C. A plasma may be generated from the fifth etchant gas and the sixth etchant gas using a plasma generator at a power from about 100 W to about 300 W, such as about 150 W. A substrate holder on which the substrate 50 is disposed during the fourth etching process may be biased with a voltage from about 200 V to about 400 V, such as about 250 V.

Etching the epitaxial source/drain regions 92 using the third etching process may result in a byproduct polymer being formed at the bottom of the third recesses 108 adjacent the epitaxial source/drain regions 92. The fourth etching process may then be used to remove the byproduct polymer. The fourth etching process may be anisotropic and may remove the byproduct polymer from bottom surfaces of the third recesses 108 at a higher rate than the second etching process removes the byproduct polymer from side surfaces of the third recesses 108. As such, the third etching process and the fourth etching process may be used to anisotropically etch the epitaxial source/drain regions 92.

In FIGS. 22A-22F, source/drain contacts 112 are formed. The source/drain contacts 112 are formed in the third recesses 108. A liner, such as a diffusion barrier layer, an adhesion layer, or the like, and a conductive material are formed in the third recesses 108. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. For example, a nitridation process, such as including a nitrogen plasma process, may be performed on the adhesion layer to convert at least the portion of the adhesion layer into the diffusion barrier layer. In some embodiments, the adhesion layer may be completely converted such that no adhesion layer remains and the diffusion barrier layer is an adhesion/barrier layer. In some embodiments, a portion of the adhesion layer remains unconverted such that the portion of the adhesion layer remains with the diffusion barrier layer being on the adhesion layer.

Silicide region may be formed adjacent the epitaxial source/drain regions 92 by reacting a portion of the epitaxial source/drain regions 92 adjacent the liner with the liner. An anneal, such as a rapid thermal anneal (RTA) may be performed to facilitate the reaction of the epitaxial source/drain regions 92 with the liner.

The conductive material may be copper, a copper alloy, silver, gold, tungsten, cobalt, aluminum, nickel, or the like. The conductive material may be deposited by ALD, CVD, PVD, or the like. A planarization process, such as a CMP, may be performed to remove excess material from a surface of the second ILD 106 after the liner and the conductive material are formed. The remaining liner and conductive material form the source/drain contacts 112 in the third recesses 108. The source/drain contacts 112 are physically and electrically coupled to the epitaxial source/drain regions 92.

Figures 22A, 22B, 22C:
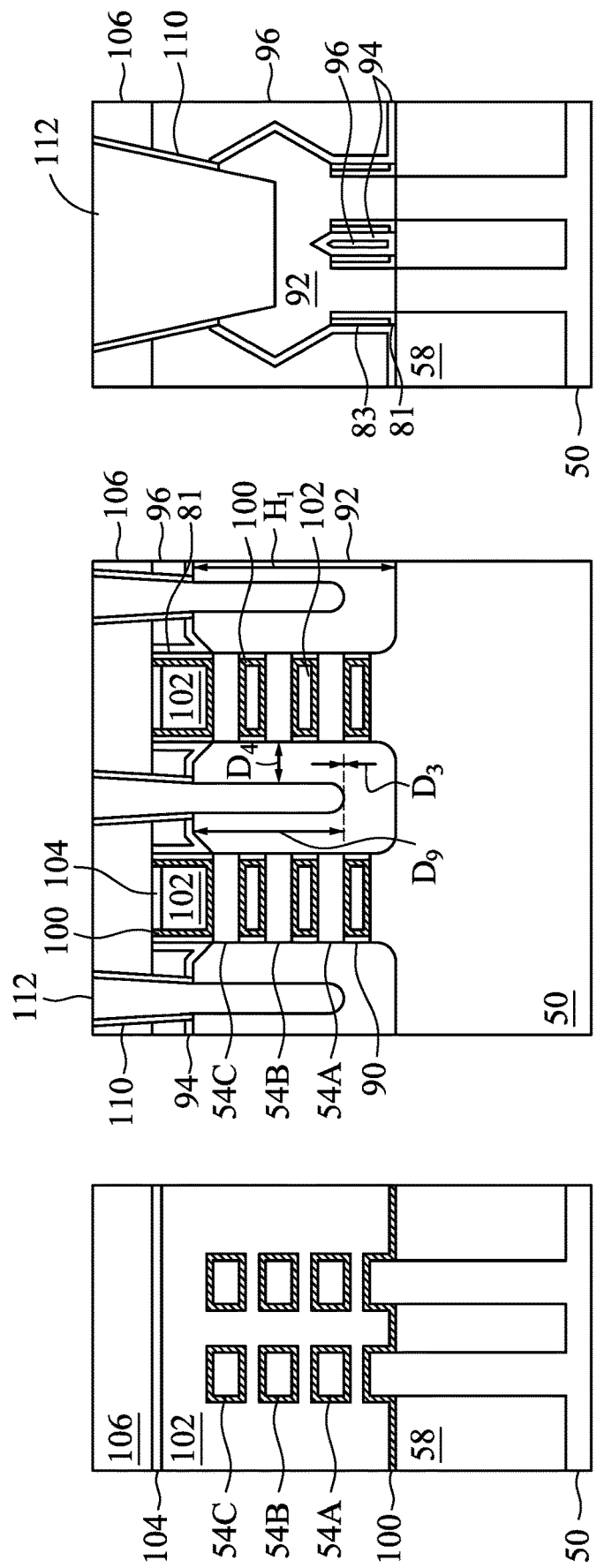

Bottom surfaces of the source/drain contacts 112 may be level with, disposed above, or disposed below bottom surfaces of the second semiconductor layer 54A. The bottom surfaces of the source/drain contacts 112 may also be disposed below bottom surfaces of the second semiconductor layers 54B and 54C, and below top surfaces of the second semiconductor layers 54A-54C. A vertical distance $D_3$ between the bottom surfaces of the source/drain contacts 112 and the bottom surfaces of the second semiconductor layer 54A may be from about 10 nm, to about 14 nm, such as about 12 nm. The source/drain contacts 112 may be laterally separated from the second semiconductor layers 54A-54C by a distance $D_4$ from about 4 nm to about 8 nm, such as about 6 nm. The bottom surfaces of the source/drain contacts 112 may extend into the epitaxial source/drain regions 92 to a depth $D_9$, which may be greater than about 18 nm or from about 13 nm to about 23 nm, such as about 18 nm, below the top surfaces of the epitaxial source/drain regions 92. A ratio of the depth $D_9$ of the source/drain contacts 112 to the height $H_1$ of the epitaxial source/drain regions 92 may be from about 1:3 to about 1:2, such as about 2:5. Forming the epitaxial source/drain regions 92 and the source/drain contacts 112 according to this ratio minimizes source/drain contact resistance ($R_{csd}$), while ensuring sufficient material of the epitaxial source/drain regions 92 remains to effectively function as a source/drain region. Portions of the gate dielectric layers 100 and the gate electrodes 102 may extend below the bottom surfaces of the source/drain contacts 112. For example, as illustrated in FIGS. 22B and 22F, portions of the gate dielectric layers 100 and the gate electrodes 102 formed between the substrate 50 and the second semiconductor layers 54A may extend below the bottom surfaces of the source/drain contacts 112. In some embodiments, portions of the gate dielectric layers 100 and the gate electrodes 102 formed between the second semiconductor layers 54A and the second semiconductor layers 54B may extend below the bottom surfaces of the source/drain contacts 112.

Etching the epitaxial source/drain regions 92 to form the third recesses 108 and forming the source/drain contacts 112 in the third recesses 108 reduces the distance between the source/drain contacts 112 and the second semiconductor layers 54A-54C which act as channels in completed NSFETs. For example, a maximum distance between any of the second semiconductor layers 54A-54C and the source/drain contacts 112 may be from about 4 nm to about 8 nm, such as about 6 nm. This reduces the source/drain contact resistance ($R_{csd}$), which improves device performance of NSFETs formed by the above-described methods.

Figure 22D:
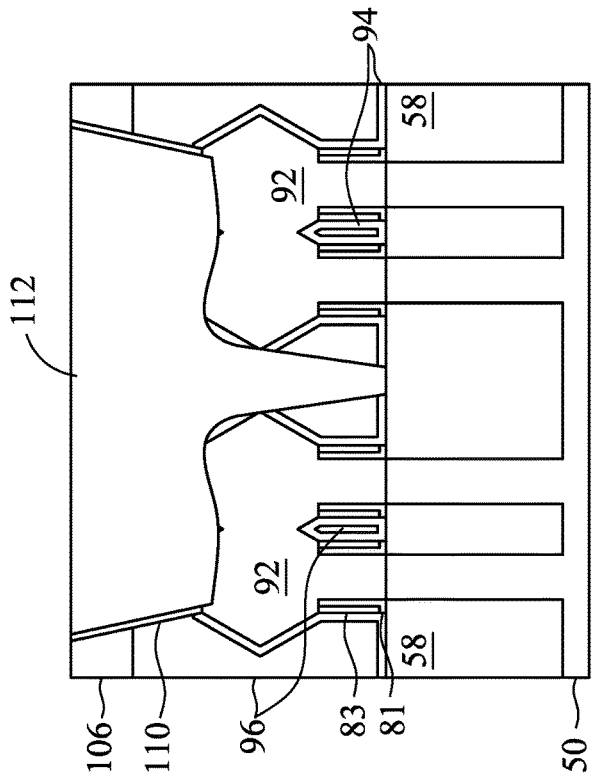
Figure 22E:
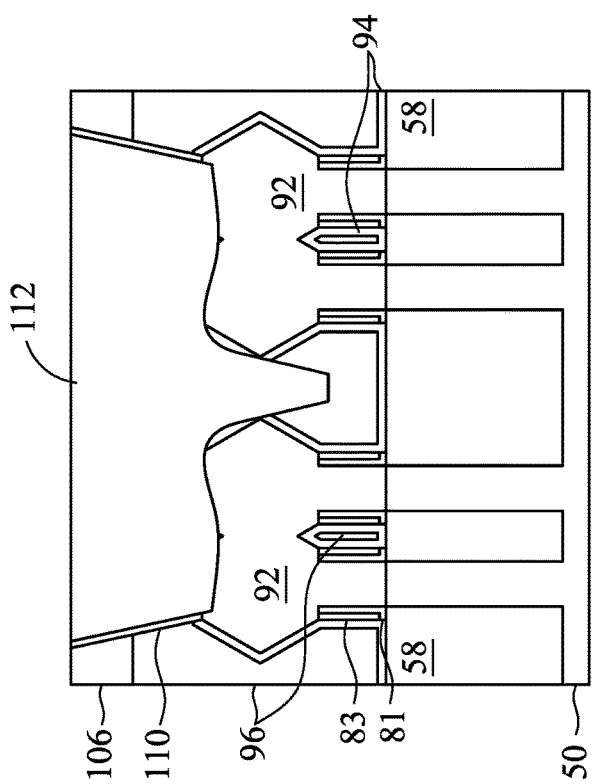
Figure 22F:
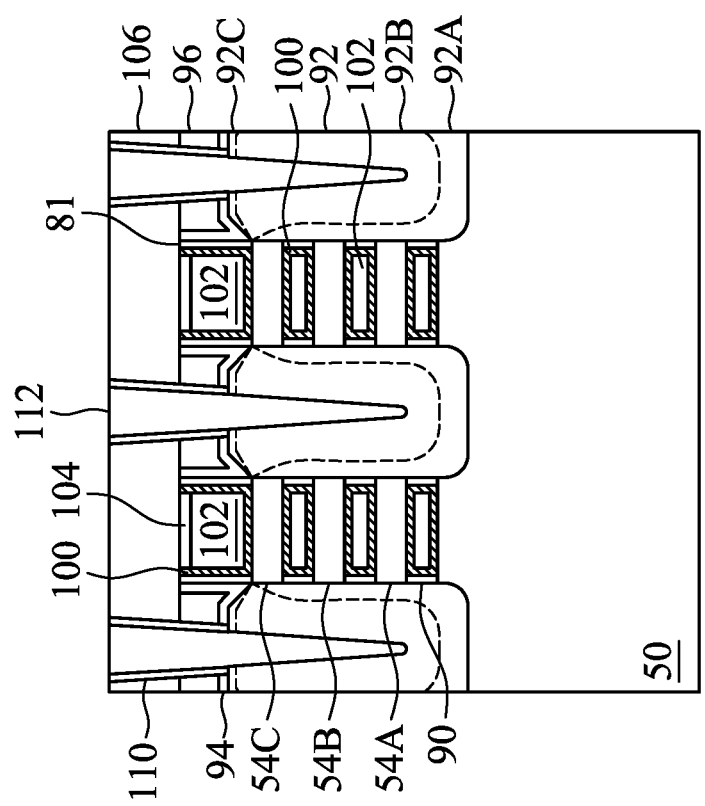

FIGS. 22D and 22E illustrate the cross section C-C' with alternative embodiments of the source/drain contacts 112. As illustrated in FIGS. 22D and 22E, the source/drain contacts 112 may contact adjacent pairs of merged epitaxial source/drain regions 92. The source/drain contacts 112 may contact the epitaxial source/drain regions 92 and may extend to greater depths between the pairs of merged epitaxial source/drain regions 92. The source/drain contacts 112 may have a more square profile, as illustrated in FIG. 22D, or a more wavy profile, as illustrated in FIG. 22E. Bottom surfaces of the source/drain contacts 112 may be disposed above the STI regions 58, or may extend to the STI regions 58. The epitaxial source/drain regions 92 may contact the above-described silicide regions of the source/drain contacts 112. Forming the source/drain contacts 112 in contact with adjacent pairs of the merged epitaxial source/drain regions 92 results in large contact areas between the source/drain contacts 112 and the epitaxial source/drain regions 92, which further reduces the source/drain contact resistance ($R_{csd}$).

FIG. 22F illustrates a profile of the source/drain contacts 112, in accordance with the embodiment illustrated in FIG. 21E. As shown by the embodiment illustrated in FIG. 22F, the source/drain contacts 112 may have inclined sidewalls which are substantially straight adjacent the third spacers 110 and adjacent the epitaxial source/drain regions 92, which extend to a rounded point. The epitaxial source/drain regions 92 may contact silicide regions of the source/drain contacts 112. In some embodiments, the source/drain contacts 112 may extend through the third semiconductor material layer 92C and partially through the second semiconductor material layer 92B. However, in some embodiments, the source/drain contacts 112 may extend only partially through the third semiconductor material layer 92C; through the third semiconductor material layer 92C, through the second semiconductor material layer 92B, and partially through the first semiconductor material layer 92A; or the like.

Figure 23B:
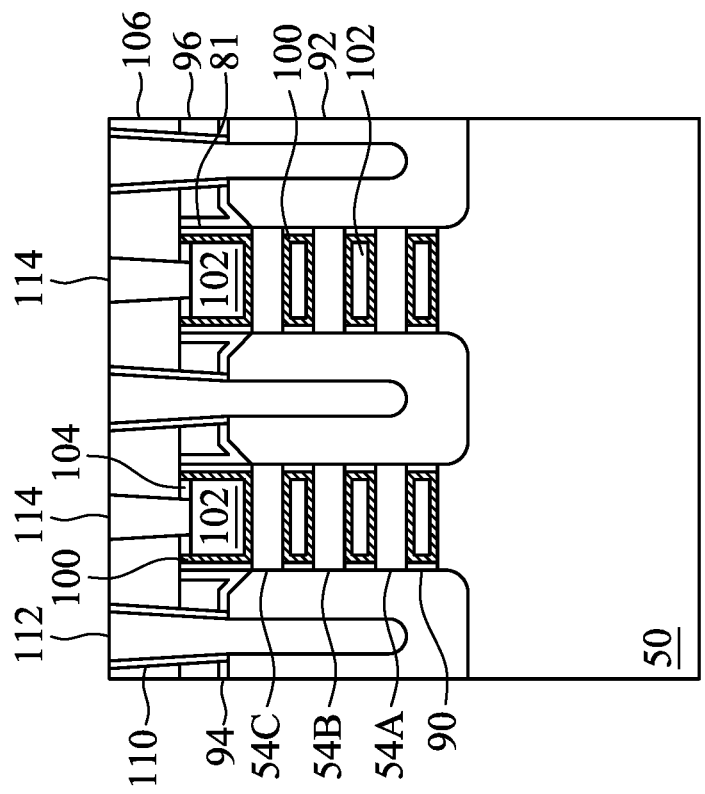
Figure 23A:
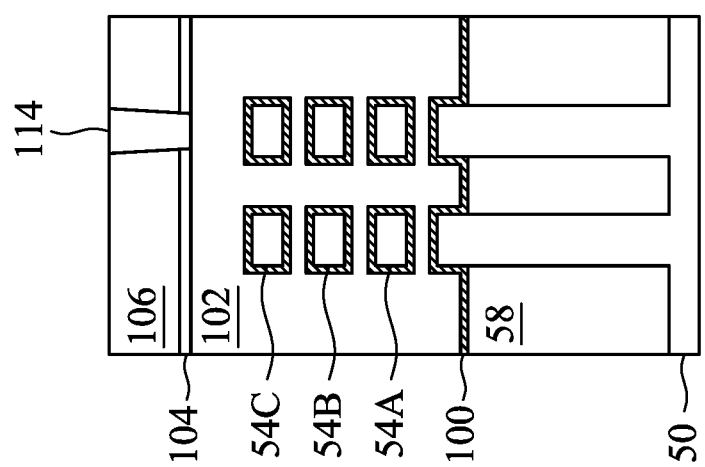

In FIGS. 23A and 23B, gate contacts 114 are formed. Openings for the gate contacts 114 are formed through the second ILD 106 and the gate mask 104. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106. The remaining liner and conductive material form the gate contacts 114 in the openings. The gate contacts 114 are physically and electrically coupled to the gate electrodes 102. In different embodiments, the gate contacts 114 may be formed by the same processes at the same time as the source/drain contacts 112 or by different processes and before or after the source/drain contacts 112. Although shown as being formed in the same cross-sections, it should be appreciated that each of the source/drain contacts 112 and the gate contacts 114 may be formed in different cross-sections, which may avoid shorting of the contacts.

Figure 24:
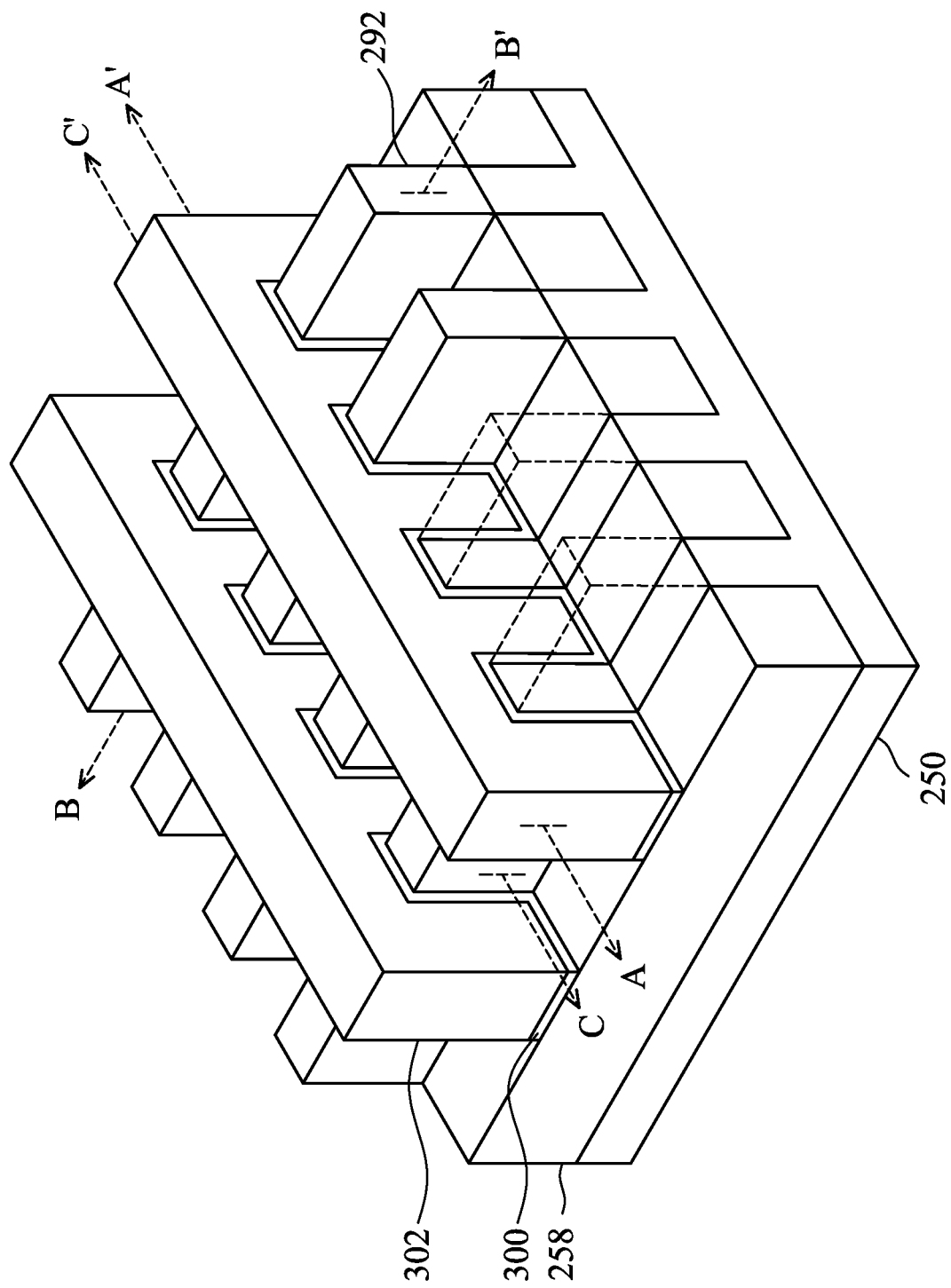
FIG. 24 illustrates an example of a semiconductor device including fin field-effect transistors (FinFETs) in a three-dimensional view, in accordance with some embodiments.

FIGS. 24-41B illustrate an embodiment in which the above-described teachings are applied to fin field effect transistors (FinFETs). FIG. 24 illustrates an example of FinFETs, in accordance with some embodiments. The FinFETs comprises fins 255 on a substrate 250 (e.g., a semiconductor substrate). Shallow trench isolation (STI) regions 258 are disposed in the substrate 250, and the fins 255 protrudes above and from between neighboring STI regions 258. Although the STI regions 258 are described/illustrated as being separate from the substrate 250, as used herein the term "substrate" may be used to refer to just the semiconductor substrate or a semiconductor substrate inclusive of STI regions. Additionally, although the fins 255 are illustrated as single, continuous materials with the substrate 250, the fins 255 and/or the substrate 250 may comprise a single material or a plurality of materials. In this context, the fins 255 refer to the portions extending between the neighboring STI regions 258.

Gate dielectric layers 300 are along sidewalls and over a top surface of the fins 255, and gate electrodes 302 are over the gate dielectric layers 300. Epitaxial source/drain regions 292 are disposed on opposite sides of the fins 255, the gate dielectric layers 300, and the gate electrodes 302. FIG. 24 further illustrates reference cross-sections that are used in later figures. Cross-section A-A' is along a longitudinal axis of a gate electrode 302 and in a direction, for example, perpendicular to the direction of current flow between the epitaxial source/drain regions 292 of the FinFETs. Cross-section B-B' is perpendicular to cross-section A-A' and is along a longitudinal axis of a fin 255 and in a direction of, for example, the current flow between the epitaxial source/drain regions 292 of the FinFETs. Cross-section C-C' is parallel to cross-section A-A' and extends through the epitaxial source/drain regions 292 of the FinFETs. Subsequent figures refer to these reference cross-sections for clarity.

FIGS. 25 through 41B are cross-sectional views of intermediate stages in the manufacturing of FinFETs, in accordance with some embodiments. FIGS. 25 through 28 illustrate reference cross-section A-A' illustrated in FIG. 24. FIGS. 29A, 34A, 35A, 36A, 37A, 38A, and 41A are illustrated along reference cross-section A-A' illustrated in FIG. 24. FIGS. 29B, 30B, 31B, 32B, 33B, 34B, 35B, 36B, 37B, 38B, 39B, 39C, 40B, 40C, and 41B are illustrated along a similar cross-section B-B' illustrated in FIG. 24. FIGS. 30A, 31A, 32A, 33A, 33C, 34C, 38C, 39A, and 40A are illustrated along reference cross-section C-C' illustrated in FIG. 24.

Figure 25:
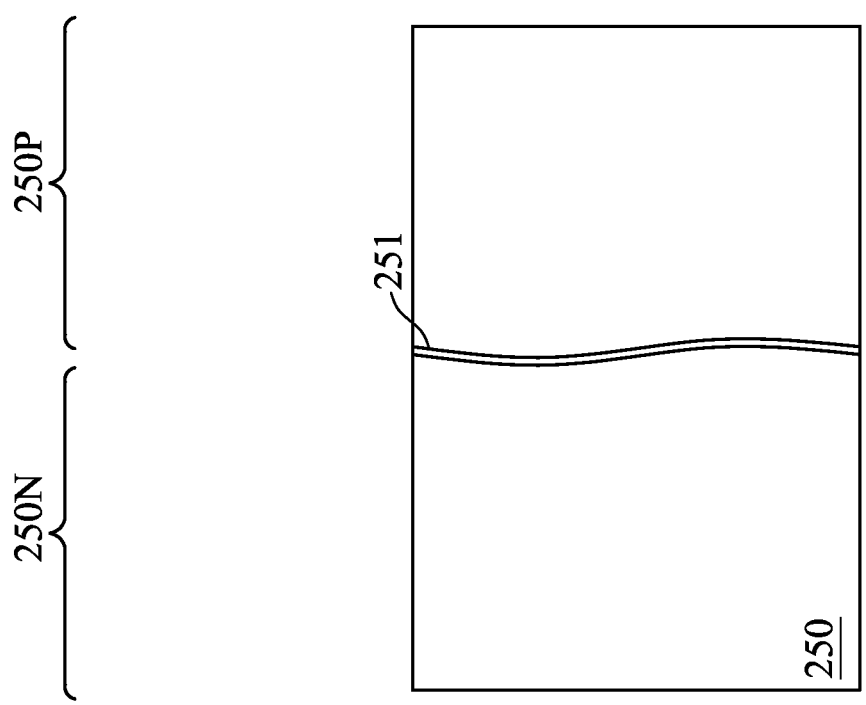

In FIG. 25, a substrate 250 is provided. The substrate 250 may be a semiconductor substrate, such as a bulk semiconductor, a semiconductor-on-insulator (SOI) substrate, or the like, which may be doped (e.g., with a p-type or an n-type dopant) or undoped. The substrate 250 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 250 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 250 has a region 250N and a region 250P. The region 250N can be for forming n-type devices, such as NMOS transistors, e.g., n-type FinFETs. The region 250P can be for forming p-type devices, such as PMOS transistors, e.g., p-type FinFETs. The region 250N may be physically separated from the region 250P (as illustrated by divider 251), and any number of device features (e.g., other active devices, doped regions, isolation structures, etc.) may be disposed between the region 250N and the region 250P.

Figure 26:
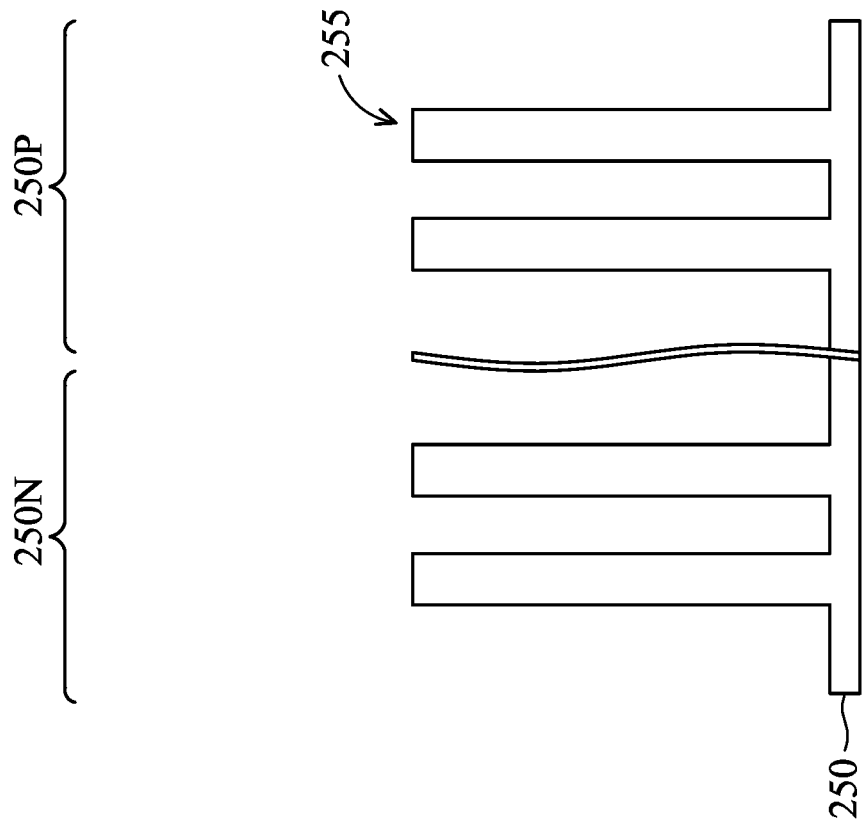

In FIG. 26, fins 255 are formed in the substrate 250. The fins 255 are semiconductor strips. In some embodiments, the fins 255 may be formed in the substrate 250 by etching trenches in the substrate 250. The etching may be any acceptable etch process, such as a reactive ion etch (RIE), a neutral beam etch (NBE), the like, or a combination thereof. The etch may be anisotropic.

The fins 255 may be patterned by any suitable method. For example, the fins 255 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 255. In some embodiments, the mask (or other layer) may remain on the fins 255.

Figures 27, 28:
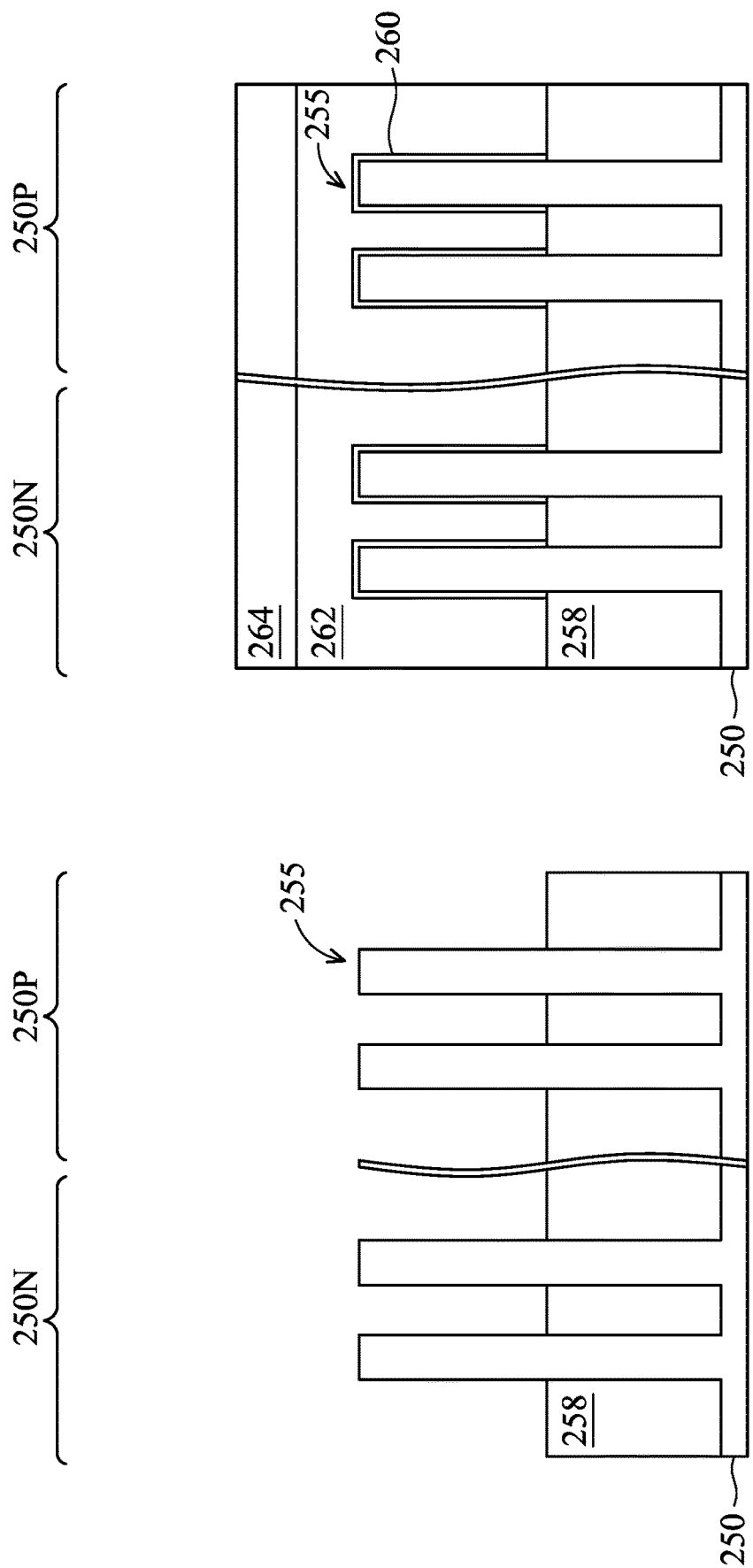

In FIG. 27, shallow trench isolation (STI) regions 258 are formed adjacent the fins 255. The STI regions 258 may be formed by forming an insulation material (not separately illustrated) over the substrate 250 and between neighboring fins 255. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the fins 255. The insulation material may comprise a single layer or may utilize multiple layers. For example, in some embodiments a liner (not separately illustrated) may first be formed along surfaces of the substrate 250 and the fins 255. Thereafter, a fill material, such as those discussed above may be formed over the liner.

A removal process is then applied to the insulation material to remove excess insulation material over the fins 255. In some embodiments, a planarization process such as a chemical mechanical polish (CMP), an etch-back process, combinations thereof, or the like may be utilized. The planarization process may planarize the insulation material and the fins 255. The planarization process exposes the fins 255 such that top surfaces of the fins 255 and the insulation material are level after the planarization process is complete.

The insulation material is then recessed to form the STI regions 258 as illustrated in FIG. 27. The insulation material is recessed such that upper portions of the fins 255 and the substrate 250 protrude from between neighboring STI regions 258. Further, the top surfaces of the STI regions 258 may have flat surfaces as illustrated, convex surfaces, concave surfaces (such as dishing), or a combination thereof. The top surfaces of the STI regions 258 may be formed flat, convex, and/or concave by an appropriate etch. The STI regions 258 may be recessed using an acceptable etching process, such as one that is selective to the material of the insulation material (e.g., etches the material of the insulation material at a faster rate than the material of the fins 255 and the substrate 250). For example, an oxide removal using, for example, dilute hydrofluoric (dHF) acid may be used.

The process described with respect to FIGS. 25-27 is just one example of how the fins 255 may be formed. In some embodiments, the fins 255 may be formed by an epitaxial growth process. For example, a dielectric layer can be formed over a top surface of the substrate 250, and trenches can be etched through the dielectric layer to expose the underlying substrate 250. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 255. For example, the fins 255 in FIG. 27 can be recessed, and a material different from the fins 255 may be epitaxially grown over the recessed fins 255. In such embodiments, the fins 255 comprise the recessed material as well as the epitaxially grown material disposed over the recessed material. In an even further embodiment, a dielectric layer can be formed over a top surface of the substrate 250, and trenches can be etched through the dielectric layer. Heteroepitaxial structures can then be epitaxially grown in the trenches using a material different from the substrate 250, and the dielectric layer can be recessed such that the heteroepitaxial structures protrude from the dielectric layer to form the fins 255. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 250N (e.g., an NMOS region) different from the material in region 250P (e.g., a PMOS region). In various embodiments, upper portions of the fins 255 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 27, appropriate wells (not separately illustrated) may be formed in the fins 255 and/or the substrate 250. In some embodiments, a P well may be formed in the region 250N, and an N well may be formed in the region 250P. In some embodiments, a P well or an N well are formed in both the region 250N and the region 250P.

In the embodiments with different well types, the different implant steps for the region 250N and the region 250P may be achieved using a photoresist or other masks (not separately illustrated). For example, a photoresist may be formed over the fins 255 and the STI regions 258 in the region 250N. The photoresist is patterned to expose the region 250P of the substrate 250, such as a PMOS region. The photoresist can be formed by using a spin-on technique and can be patterned using acceptable photolithography techniques. Once the photoresist is patterned, an n-type impurity implant is performed in the region 250P, and the photoresist may act as a mask to substantially prevent n-type impurities from being implanted into the region 250N, such as an NMOS region. The n-type impurities may be phosphorus, arsenic, antimony, or the like implanted in the region to a concentration of equal to or less than $1\times10^{18}$ atoms/cm$^3$, such as between about $1\times10^{16}$ atoms/cm$^3$ and about $1\times10^{18}$ atoms/cm$^3$. After the implant, the photoresist is removed, such as by an acceptable ashing process.

Following the implanting of the region 250P, a photoresist is formed over the fins 255 and the STI regions 258 in the region 250P. The photoresist is patterned to expose the region 250N of the substrate 250, such as the NMOS region. The photoresist can be formed by using a spin-on technique and can be patterned using acceptable photolithography techniques. Once the photoresist is patterned, a p-type impurity implant may be performed in the region 250N, and the photoresist may act as a mask to substantially prevent p-type impurities from being implanted into the region 250P, such as the PMOS region. The p-type impurities may be boron, boron fluoride, indium, or the like implanted in the region to a concentration of equal to or less than $1\times10^{18}$ atoms/cm$^3$, such as between about $1\times10^{16}$ atoms/cm$^3$ and about $1\times10^{18}$ atoms/cm$^3$. After the implant, the photoresist may be removed, such as by an acceptable ashing process.

After the implants of the region 250N and the region 250P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

In FIG. 28, dummy dielectric layers 260 are formed on the fins 255 and the substrate 250. The dummy dielectric layers 260 may be, for example, silicon oxide, silicon nitride, a combination thereof, or the like, and may be deposited or thermally grown according to acceptable techniques. A dummy gate layer 262 is formed over the dummy dielectric layers 260, and a mask layer 264 is formed over the dummy gate layer 262. The dummy gate layer 262 may be deposited over the dummy dielectric layers 260 and then planarized by a process such as CMP. The mask layer 264 may be deposited over the dummy gate layer 262. The dummy gate layer 262 may be conductive or non-conductive materials and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 262 may be deposited by physical vapor deposition (PVD), CVD, sputter deposition, or other techniques known and used in the art for depositing the selected material. The dummy gate layer 262 may be made of other materials that have a high etching selectivity from the material of the STI regions 258. The mask layer 264 may include, for example, silicon nitride, silicon oxynitride, or the like. In this example, a single dummy gate layer 262 and a single mask layer 264 are formed across the region 250N and the region 250P. It is noted that the dummy dielectric layers 260 are shown covering only the fins 255 and the substrate 250 for illustrative purposes only. In some embodiments, the dummy dielectric layers 260 may be deposited such that the dummy dielectric layers 260 cover the STI regions 258, extending between the dummy gate layer 262 and the STI regions 258.

FIGS. 29A through 41B illustrate various additional steps in the manufacturing of embodiment devices. FIGS. 29B through 41B illustrate features in either of the region 250N or the region 250P. For example, the structures illustrated in FIGS. 29B through 41B may be applicable to both the region 250N and the region 250P. Differences (if any) in the structures of the region 250N and the region 250P are described in the text accompanying each figure.

Figure 29B:
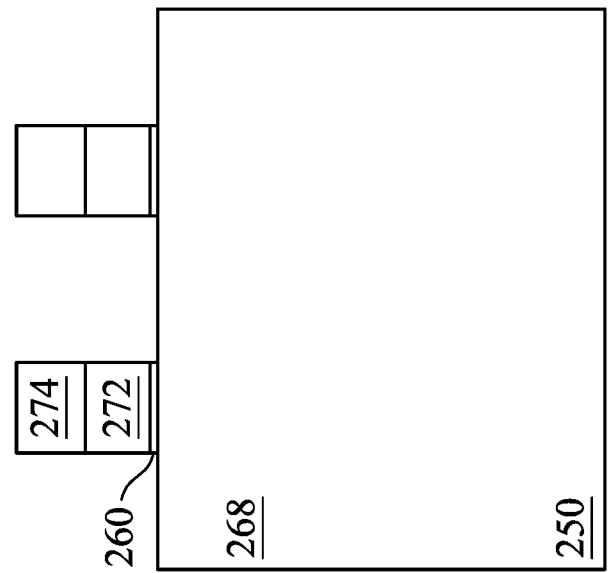
Figure 29A:
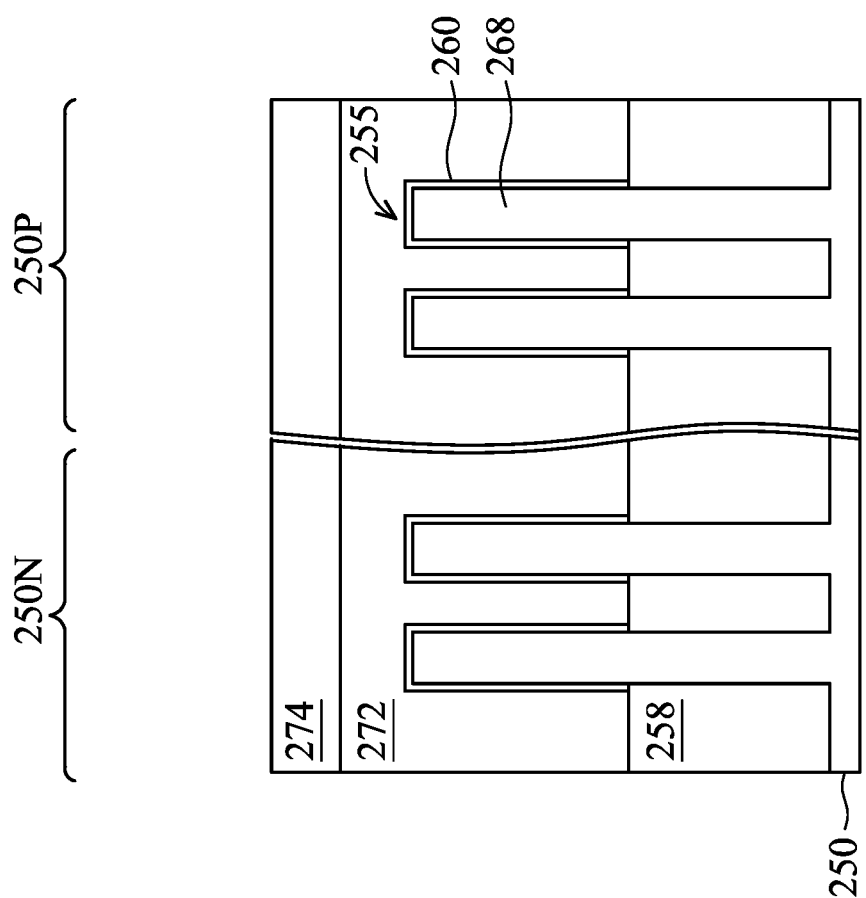

In FIGS. 29A and 29B, the mask layer 264 (see FIG. 28) may be patterned using acceptable photolithography and etching techniques to form masks 274. An acceptable etching technique may be used to transfer the pattern of the masks 274 to the dummy gate layer 262 to form dummy gates 272. In some embodiments, the pattern of the masks 274 may also be transferred to the dummy dielectric layers 260. The dummy gates 272 cover respective channel regions 268 of the fins 255. The pattern of the masks 274 may be used to physically separate each of the dummy gates 272 from adjacent dummy gates. The dummy gates 272 may also have a lengthwise direction substantially perpendicular to the lengthwise direction of respective fins 255.

Figure 30B:
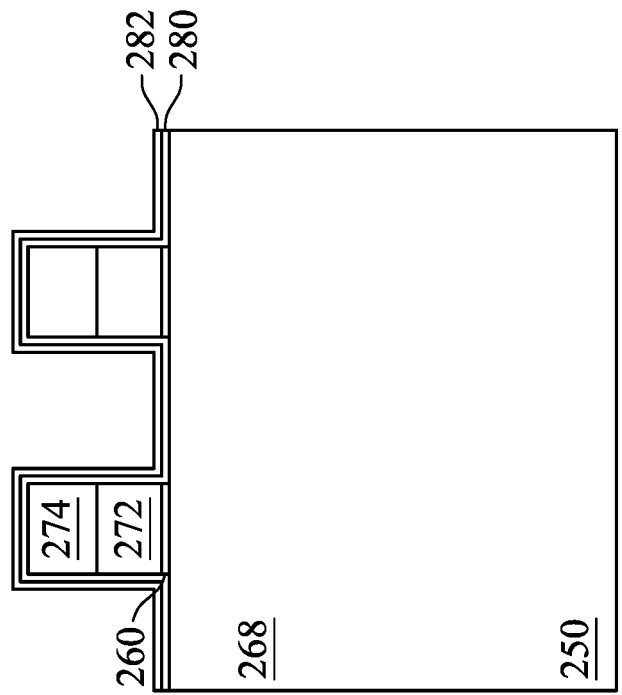
Figure 30A:
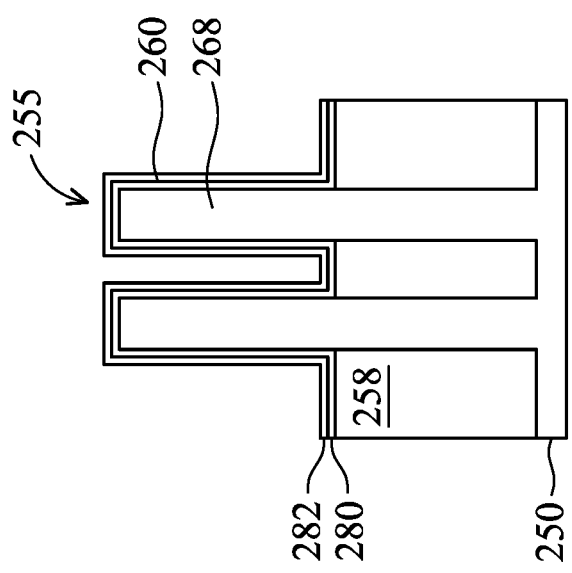

In FIGS. 30A and 30B, a first spacer layer 280 and a second spacer layer 282 are formed over the structures illustrated in FIGS. 29A and 29B. In FIGS. 30A and 30B, the first spacer layer 280 is formed on top surfaces of the STI regions 258, top surfaces and sidewalls of the fins 255 and the masks 274, and sidewalls of the dummy gates 272 and the dummy dielectric layers 260. The second spacer layer 282 is deposited over the first spacer layer 280. The first spacer layer 280 may be formed by thermal oxidation or deposited by CVD, ALD, or the like. The first spacer layer 280 may be formed of silicon oxide, silicon nitride, silicon oxynitride, or the like. The second spacer layer 282 may be deposited by CVD, ALD, or the like. The second spacer layer 282 may be formed of silicon oxide, silicon nitride, silicon oxynitride, or the like.

Figure 31B:
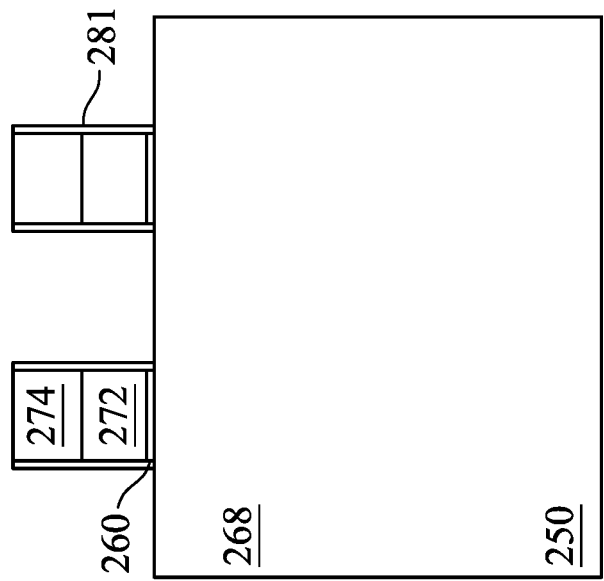
Figure 31A:
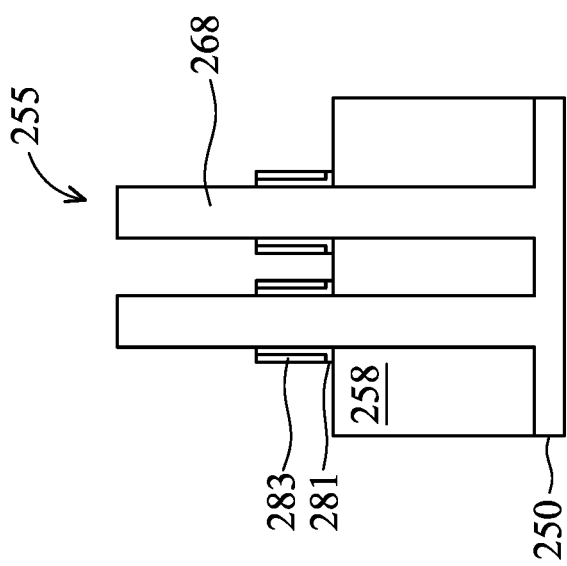

In FIGS. 31A and 31B, the first spacer layer 280 and the second spacer layer 282 are etched to form first spacers 281 and second spacers 283. The first spacer layer 280 and the second spacer layer 282 may be etched using a suitable etching process, such as an isotropic etching process (e.g., a wet etching process), an anisotropic etching process (e.g., a dry etching process), or the like. As illustrated in FIG. 31A, the first spacers 281 and the second spacers 283 are disposed on sidewalls of the fins 255. As illustrated in FIG. 31B, the second spacer layer 282 may be removed from over the first spacer layer 280 adjacent the masks 274, the dummy gates 272, and the dummy dielectric layers 260 and the first spacers 281 are disposed on sidewalls of the masks 274, the dummy gates 272, and the dummy dielectric layers 260.

After the first spacers 281 and the second spacers 283 are formed, implants for lightly doped source/drain (LDD) regions (not separately illustrated) may be performed. In embodiments with different device types, similar to the implants discussed above in FIG. 27, a mask, such as a photoresist, may be formed over the region 250N, while exposing the region 250P, and appropriate type (e.g., p-type) impurities may be implanted into the exposed fins 255 and the substrate 250 in the region 250P. The mask may then be removed. Subsequently, a mask, such as a photoresist, may be formed over the region 250P while exposing the region 250N, and appropriate type impurities (e.g., n-type) may be implanted into the exposed fins 255 and the substrate 250 in the region 250N. The mask may then be removed. The n-type impurities may be the any of the n-type impurities previously discussed, and the p-type impurities may be the any of the p-type impurities previously discussed. The lightly doped source/drain regions may have a concentration of impurities of from about $1\times10^{15}$ atoms/cm$^3$ to about $1\times10^{19}$ atoms/cm$^3$. An anneal may be used to repair implant damage and to activate the implanted impurities. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacers 281 may be formed prior to forming the second spacers 283, additional spacers may be formed and removed, and/or the like. Furthermore, the n-type and p-type devices may be formed using a different structures and steps.

Figure 32B:
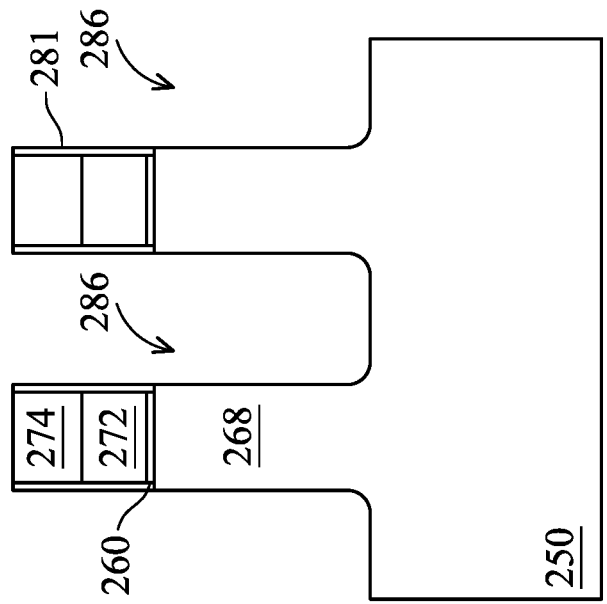
Figure 32A:
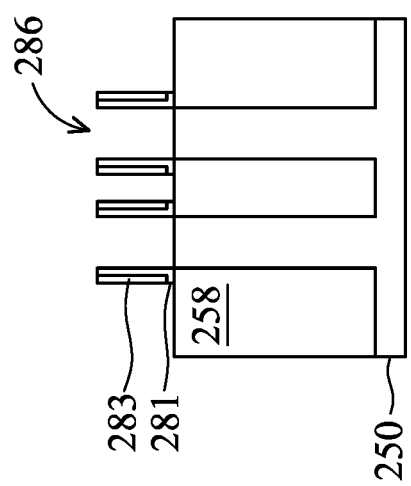

In FIGS. 32A and 32B, first recesses 286 are formed in the fins 255 and the substrate 250. As illustrated in FIG. 32A, top surfaces of the STI regions 258 may be level with top surfaces of the substrate 250. The substrate 250 may be etched such that bottom surfaces of the first recesses 286 are disposed above or below the top surfaces of the STI regions 258. The first recesses 286 may be formed by etching the fins 255 and the substrate 250 using anisotropic etching processes, such as RIE, NBE, or the like. The first spacers 281, the second spacers 283, and the masks 274 mask portions of the fins 255 and the substrate 250 during the etching processes used to form the first recesses 286. A single etch process or multiple etch processes may be used to form the first recesses 286. Timed etch processes may be used to stop the etching of the first recesses 286 after the first recesses 286 reach a desired depth.

In FIGS. 33A-33C, epitaxial source/drain regions 292 are formed in the first recesses 286 to exert stress on the channel regions 268 of the fins 255, thereby improving performance. As illustrated in FIG. 33B, the epitaxial source/drain regions 292 are formed in the first recesses 286 such that each dummy gate 272 is disposed between respective neighboring pairs of the epitaxial source/drain regions 292. The epitaxial source/drain regions 292 may have heights H$_2$ from about 40 nm to about 60 nm, such as about 50 nm. In some embodiments, the first spacers 281 are used to separate the epitaxial source/drain regions 292 from the dummy gates 272 by an appropriate lateral distance so that the epitaxial source/drain regions 292 do not short out subsequently formed gates of the resulting FinFETs.

The epitaxial source/drain regions 292 in the region 250N, e.g., the NMOS region, may be formed by masking the region 250P, e.g., the PMOS region. Then, the epitaxial source/drain regions 292 are epitaxially grown in the first recesses 286. The epitaxial source/drain regions 292 may include any acceptable material, such as appropriate for n-type FinFETs. For example, if the fins 255 are silicon, the epitaxial source/drain regions 292 may include materials exerting a tensile strain on the fins 255, such as silicon, silicon carbide, phosphorous doped silicon carbide, silicon phosphide, or the like. The epitaxial source/drain regions 292 may have surfaces raised from respective surfaces of the fins 255 and may have facets.

The epitaxial source/drain regions 292 in the region 250P, e.g., the PMOS region, may be formed by masking the region 250N, e.g., the NMOS region. Then, the epitaxial source/drain regions 292 are epitaxially grown in the first recesses 286. The epitaxial source/drain regions 292 may include any acceptable material, such as appropriate for p-type FinFETs. For example, if the fins 255 are silicon, the epitaxial source/drain regions 292 may comprise materials exerting a compressive strain on the fins 255, such as silicon-germanium, boron doped silicon-germanium, germanium, germanium tin, or the like. The epitaxial source/drain regions 292 may also have surfaces raised from respective surfaces of the fins 255 and may have facets.

The epitaxial source/drain regions 292, the fins 255, and/or the substrate 250 may be implanted with dopants to form source/drain regions, similar to the process previously discussed for forming lightly-doped source/drain regions, followed by an anneal. In some embodiments, the epitaxial source/drain regions 292 may be in situ doped with the dopants during growth. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed.

As a result of the epitaxy processes used to form the epitaxial source/drain regions 292 in the region 250N and the region 250P, upper surfaces of the epitaxial source/drain regions 292 have facets which expand laterally outward beyond sidewalls of the fins 255. In some embodiments, these facets cause adjacent epitaxial source/drain regions 292 of a same FinFET to merge as illustrated by FIG. 33A. In other embodiments, adjacent epitaxial source/drain regions 292 remain separated after the epitaxy process is completed as illustrated by FIG. 33C. In the embodiments illustrated in FIGS. 33A and 33C, the first spacers 281 may be formed covering portions of the sidewalls of the fins 255 that extend above the STI regions 258 thereby blocking the epitaxial growth. In some other embodiments, the spacer etch used to form the first spacers 281 may be adjusted to remove the spacer material to allow the epitaxially grown region to extend to the surface of the STI region 258.

The epitaxial source/drain regions 292 may comprise one or more semiconductor material layers. For example, the epitaxial source/drain regions 292 may comprise a first semiconductor material layer 292A, a second semiconductor material layer 292B, and a third semiconductor material layer 292C. Any number of semiconductor material layers may be used for the epitaxial source/drain regions 292. Each of the first semiconductor material layer 292A, the second semiconductor material layer 292B, and the third semiconductor material layer 292C may be formed of different semiconductor materials and may be doped to different dopant concentrations. In some embodiments, the first semiconductor material layer 292A may have a dopant concentration less than the second semiconductor material layer 292B and greater than the third semiconductor material layer 292C. In embodiments in which the epitaxial source/drain regions 292 comprise three semiconductor material layers, the first semiconductor material layer 292A may be deposited, the second semiconductor material layer 292B may be deposited over the first semiconductor material layer 292A, and the third semiconductor material layer 292C may be deposited over the second semiconductor material layer 292B.

Figures 34A, 34B, 34C:
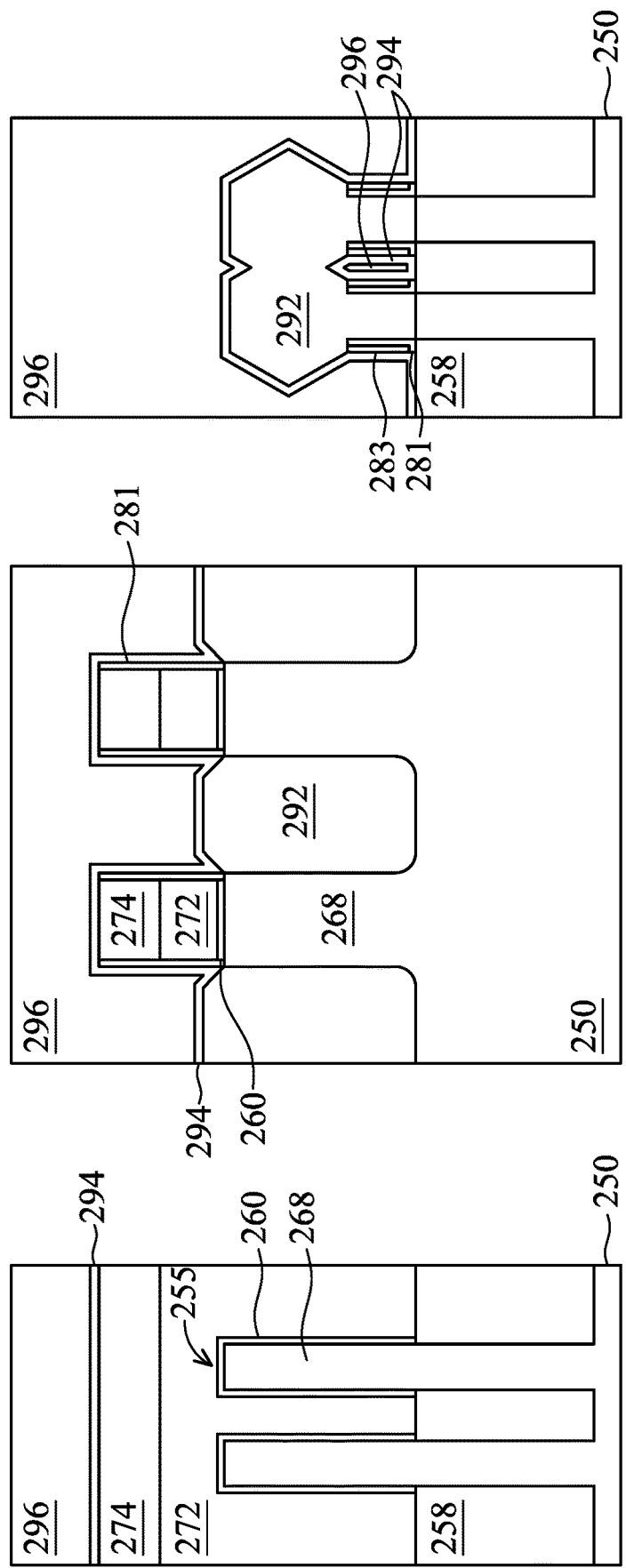

In FIGS. 34A-34C, a first interlayer dielectric (ILD) 296 is deposited over the structure illustrated in FIGS. 29A, 33B, and 33A (the processes of FIGS. 30A-33C do not alter the cross-section illustrated in FIG. 29A), respectively. The first ILD 296 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 294 is disposed between the first ILD 296 and the epitaxial source/ drain regions 292, the masks 274, and the first spacers 281. The CESL 294 may comprise a dielectric material, such as, silicon nitride, silicon oxide, silicon oxynitride, or the like, having a different etch rate than the material of the overlying first ILD 296.

Figure 35B:
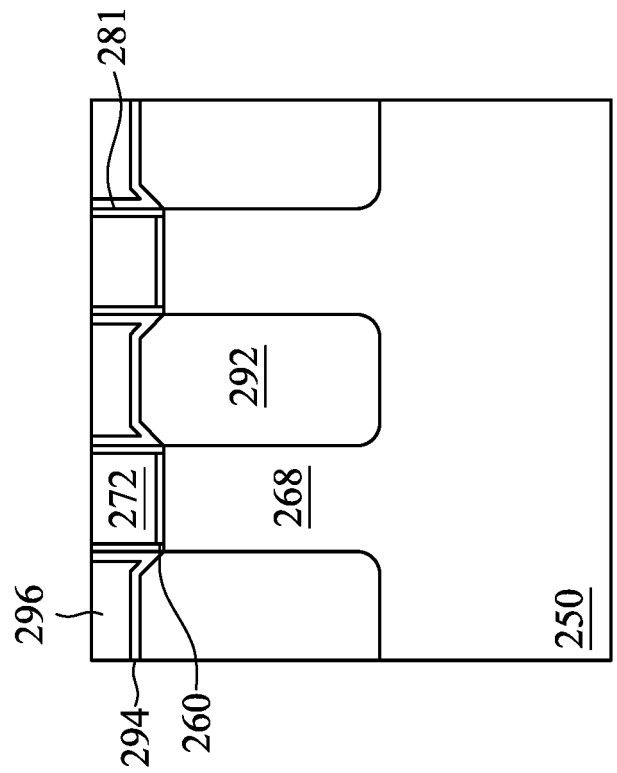
Figure 35A:
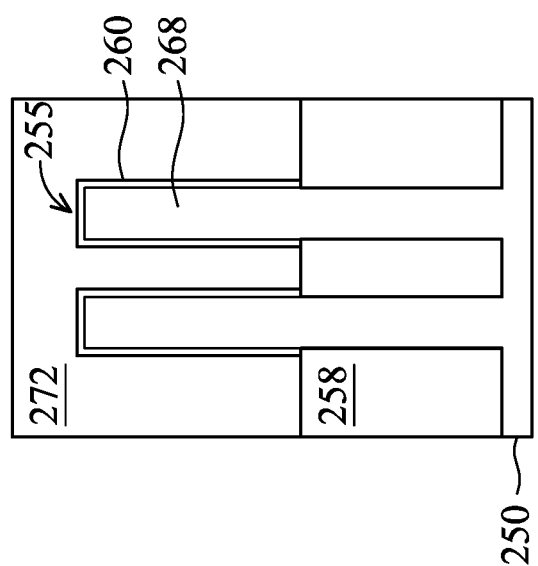

In FIGS. 35A-35C, a planarization process, such as a CMP, may be performed to level the top surface of the first ILD 296 with the top surfaces of the dummy gates 272 or the masks 274. The planarization process may also remove the masks 274 on the dummy gates 272, and portions of the first spacers 281 along sidewalls of the masks 274. After the planarization process, top surfaces of the dummy gates 272, the first spacers 281, and the first ILD 296 are level. Accordingly, the top surfaces of the dummy gates 272 are exposed through the first ILD 296. In some embodiments, the masks 274 may remain, in which case the planarization process levels the top surface of the first ILD 296 with top surface of the masks 274 and the first spacers 281.

Figure 36B:
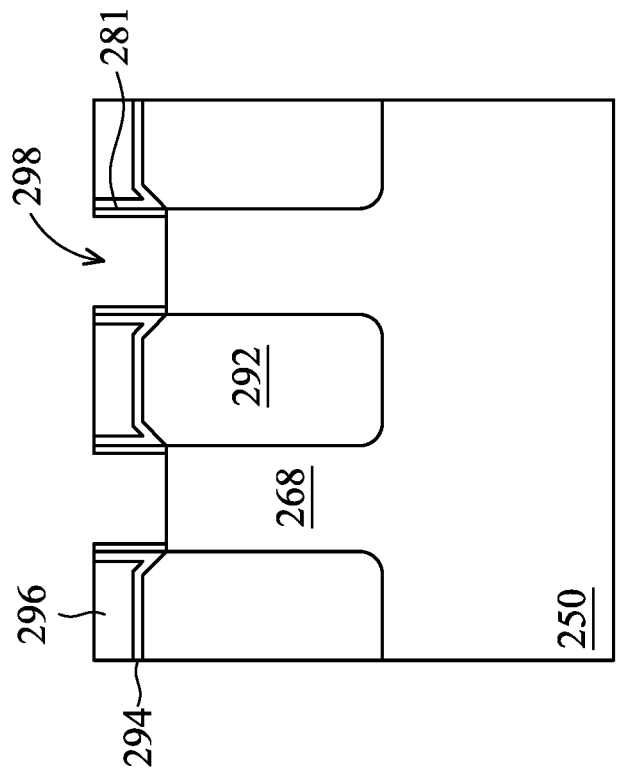
Figure 36A:
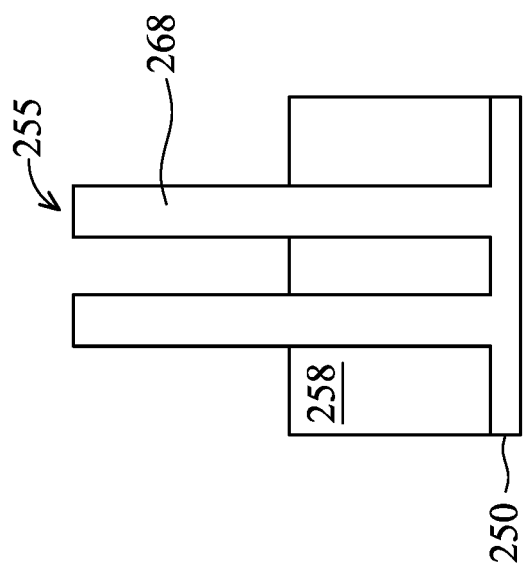

In FIGS. 36A and 36B, the dummy gates 272, and the masks 274 if present, are removed in an etching step(s), so that second recesses 298 are formed. Portions of the dummy dielectric layers 260 in the second recesses 298 may also be removed. In some embodiments, only the dummy gates 272 are removed and the dummy dielectric layers 260 remain and are exposed by the second recesses 298. In some embodiments, the dummy dielectric layers 260 are removed from second recesses 298 in a first region of a die (e.g., a core logic region) and remain in second recesses 298 in a second region of the die (e.g., an input/output region). In some embodiments, the dummy gates 272 are removed by an anisotropic dry etch process. For example, the etching process may include a dry etch process using reaction gas(es) that selectively etch the dummy gates 272 at a faster rate than the first ILD 296 or the first spacers 281. Each second recess 298 exposes and/or overlies a channel region 268 of a respective fin 255. Each channel region 268 is disposed between neighboring pairs of the epitaxial source/ drain regions 292. During the removal, the dummy dielectric layer 260 may be used as an etch stop layer when the dummy gates 272 are etched. The dummy dielectric layer 260 may then be optionally removed after the removal of the dummy gates 272.

Figure 37B:
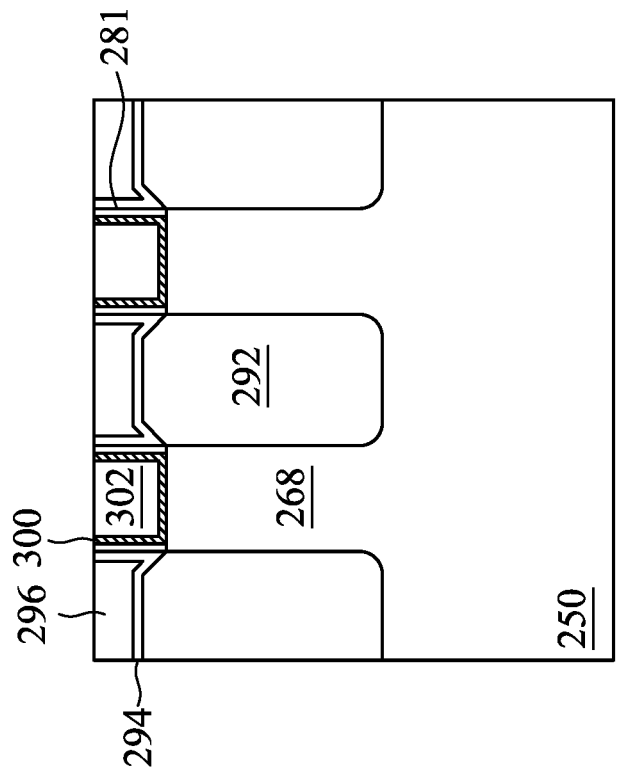
Figure 37A:
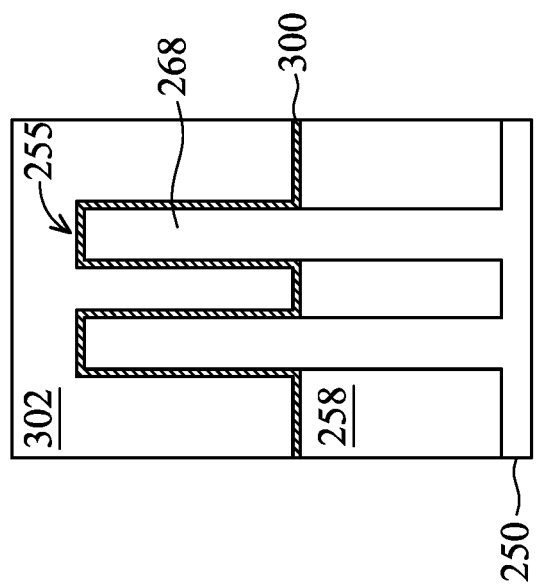

In FIGS. 37A and 37B, gate dielectric layers 300 and gate electrodes 302 are formed for replacement gates. The gate dielectric layers 300 are deposited conformally in the second recesses 298, such as on top surfaces and sidewalls of the fins 255. The gate dielectric layers 300 may also be deposited on top surfaces of the first ILD 296, the CESL 294, the first spacers 281, and the STI regions 258. In accordance with some embodiments, the gate dielectric layers 300 comprise silicon oxide, silicon nitride, or multilayers thereof. In some embodiments, the gate dielectric layers 300 include a high-k dielectric material, and in these embodiments, the gate dielectric layers 300 may have a k value greater than about 7.0, and may include a metal oxide or a silicate of hafnium, aluminum, zirconium, lanthanum, manganese, barium, titanium, lead, and combinations thereof. The formation methods of the gate dielectric layers 300 may include molecular-beam deposition (MBD), ALD, PECVD, and the like.

The gate electrodes 302 are deposited over the gate dielectric layers 300, respectively, and fill the remaining portions of the second recesses 298. The gate electrodes 302 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 302 are illustrated in FIGS. 37A and 37B, the gate electrodes 302 may comprise any number of liner layers, any number of work function tuning layers, and a fill material. After the filling of the second recesses 298, a planarization process, such as a CMP, may be performed to remove the excess portions of the gate dielectric layers 300 and the material of the gate electrodes 302, which excess portions are over the top surface of the first ILD 296. The remaining portions of material of the gate electrodes 302 and the gate dielectric layers 300 thus form replacement gates of the resulting FinFETs. The gate electrodes 302 and the gate dielectric layers 300 may be collectively referred to as "gate stacks."

The formation of the gate dielectric layers 300 in the region 250N and the region 250P may occur simultaneously such that the gate dielectric layers 300 in each region are formed from the same materials, and the formation of the gate electrodes 302 may occur simultaneously such that the gate electrodes 302 in each region are formed from the same materials. In some embodiments, the gate dielectric layers 300 in each region may be formed by distinct processes, such that the gate dielectric layers 300 may be different materials, and/or the gate electrodes 302 in each region may be formed by distinct processes, such that the gate electrodes 302 may be different materials. Various masking steps may be used to mask and expose appropriate regions when using distinct processes.

Figures 38A, 38B, 38C:
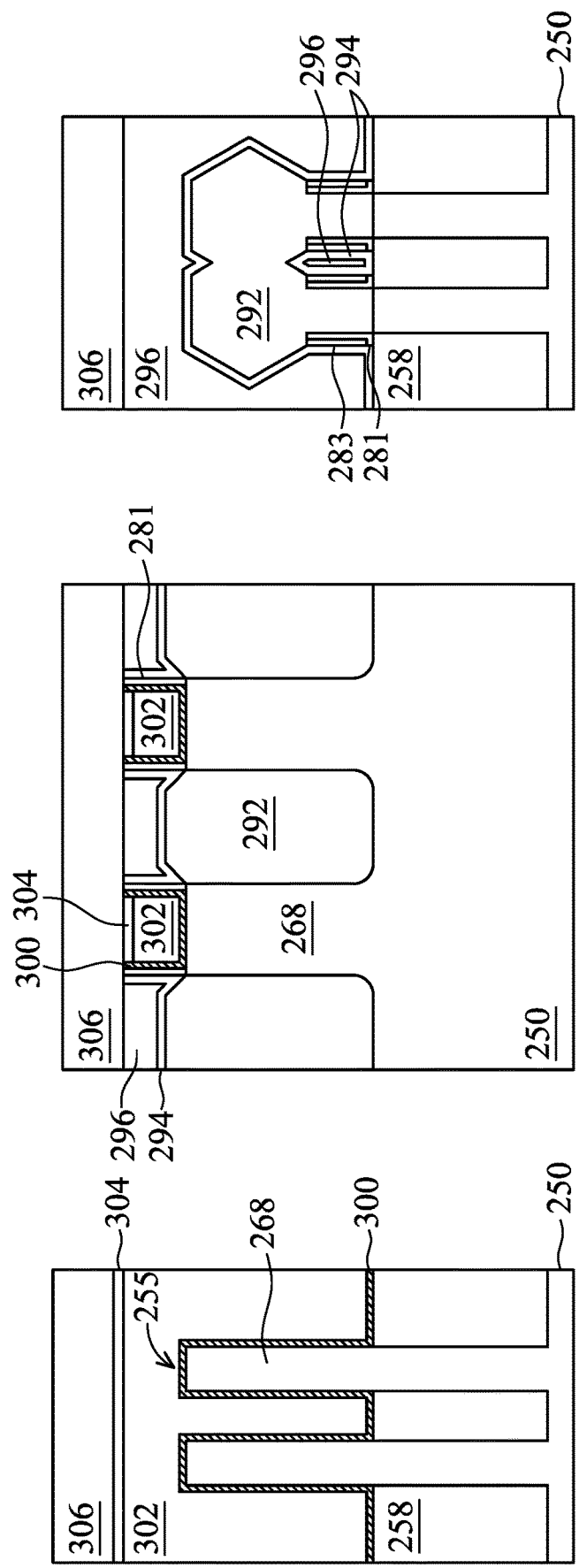

In FIGS. 38A-38C, a second ILD 306 is deposited over the first ILD 296. In some embodiments, the second ILD 306 is a flowable film formed by FCVD. In some embodiments, the second ILD 306 is formed of a dielectric material such as PSG, BSG, BPSG, USG, or the like, and may be deposited by any suitable method, such as CVD, PECVD, or the like. In accordance with some embodiments, before the formation of the second ILD 306, the gate stack (including the gate dielectric layers 300 and the corresponding overlying gate electrodes 302) is recessed, so that a recess is formed directly over the gate stack and between opposing portions of first spacers 281. A gate mask 304 comprising one or more layers of dielectric material, such as silicon nitride, silicon oxynitride, or the like, is filled in the recess, followed by a planarization process to remove excess portions of the dielectric material extending over the first ILD 296. Subsequently formed gate contacts (such as the gate contacts 314, discussed below with respect to FIGS. 41A and 41B) penetrate through the gate mask 304 to contact the top surface of the recessed gate electrodes 302.

Figure 39B:
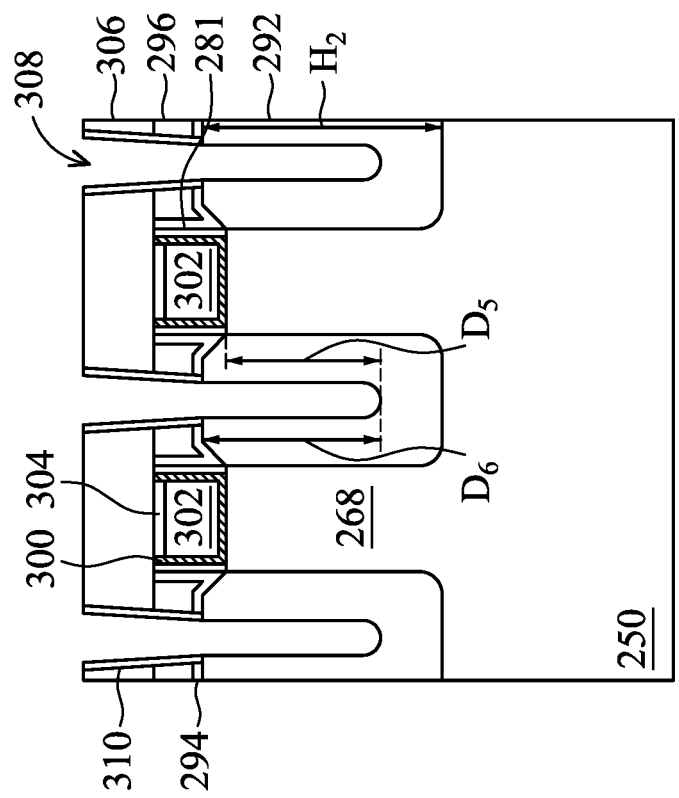
Figure 39A:
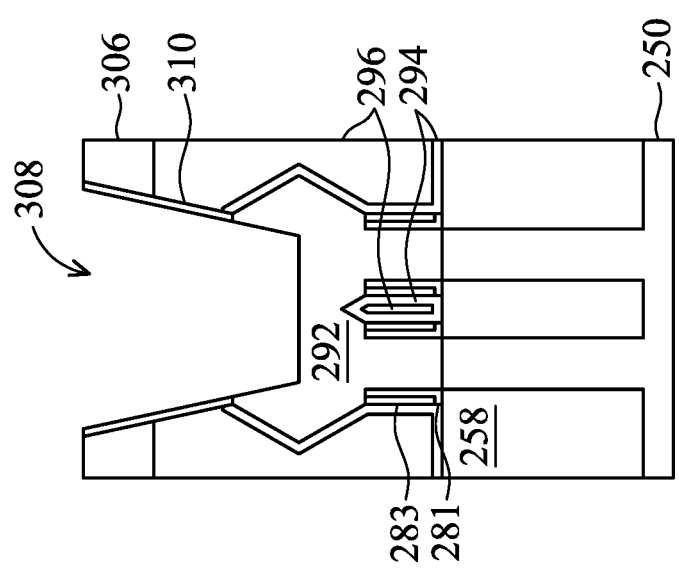
Figure 39C:
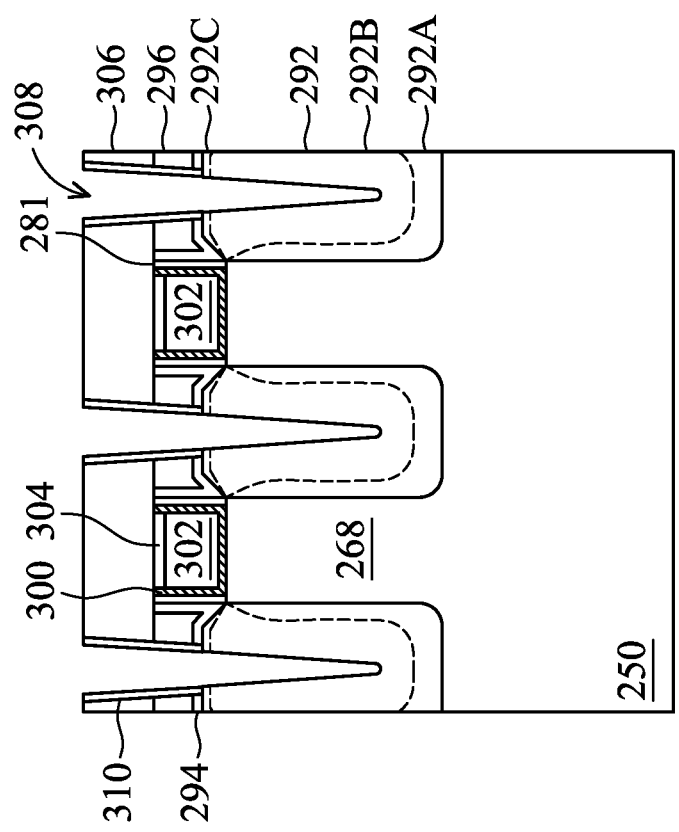

In FIGS. 39A-39C, the second ILD 306, the first ILD 296, and the CESL 294 are etched to form third recesses 308 exposing surfaces of the epitaxial source/drain regions 292. The third recesses 308 may be formed by etching using an anisotropic etching process, such as RIE, NBE, or the like. In some embodiments, the third recesses 308 may be etched through the second ILD 306 and the first ILD 296 using a first etching process and may then be etched through the CESL 294 using a second etching process. A mask, such as a photoresist, may be formed and patterned over the second ILD 306 to mask portions of the second ILD 306 from the first etching process and the second etching process.

Further in FIGS. 39A-39C third spacers 310 are formed on sidewalls of the third recesses 308. A third spacer layer (not separately illustrated) may be formed on top surfaces of the second ILD 306 and the epitaxial source/drain regions 292 and on sidewalls of the second ILD 306, the first ILD 296, and the CESL 294. The third spacer layer may be formed by thermal oxidation or deposited by CVD, ALD, or the like. The third spacer layer may be formed of silicon oxide, silicon nitride, silicon oxynitride, or the like. The third spacer layer may be etched using a suitable etching process such as anisotropic etching (e.g., a dry etch process) or the like to form the third spacers 310. As illustrated in FIGS. 39A-39C, the third spacers 310 may remain on sidewalls of the second ILD 306, the first ILD 296, and the CESL 294 in the third recesses 308. The third spacers 310 may have thicknesses from about 2 nm to about 5 nm, such as about 3 nm and may be used to protect sidewalls of the second ILD 306, the first ILD 296, and the CESL 294 from etching subsequently performed on the epitaxial source/drain regions 292. In some embodiments, the third spacers 310 may be formed of silicon nitride and may be used to prevent leakage from subsequently formed source/drain contacts (such as the source/drain contacts 312, discussed below with respect to FIGS. 40A-40C), and may be used to improve breakdown voltage ($V_{bd}$) reliability issues, thereby increasing performance and decreasing device defects.

Even further in FIGS. 39A-39C, the epitaxial source/drain regions 292 are etched to extend the third recesses 308. The epitaxial source/drain regions 292 may be etched by an anisotropic etching process such as RIE, NBE, or the like. The epitaxial source/drain regions 292 may be etched by an iterative etching process in which each iteration includes a third etching process followed by a fourth etching process. The third etching process and the fourth etching process may be different from the first etching process and the second etching process used to etch the first ILD 296, the second ILD 306, and the CESL 294. The iterative etching process may be repeated for from 5 iterations to 20 iterations, such as 10 iterations. The iterative etching process may be repeated until a depth $D_5$ of the third recesses 308 below top surfaces of the channel regions 258 of the fins 255 is greater than about 13 nm or from about 8 nm to about 18 nm, such as about 14 nm. A depth $D_6$ of the third recesses 308 below top surfaces of the epitaxial source/drain regions 292 may be greater than about 15 nm or from about 10 nm to about 20 nm, such as about 15 nm. A ratio of the depth $D_6$ of the third recesses 308 to the height $H_2$ of the epitaxial source/drain regions 292 may be from about 1:3 to about 1:2, such as about 2:5. Etching the third recesses 308 to the depths described reduces the distance between subsequently formed source/drain contacts (such as source/drain contacts 312, discussed below in reference to FIGS. 40A-40C) and the fins 255, which reduces source/drain contact resistance ($R_{csd}$) and improves device performance of FinFETs. Etching the third recesses 308 to too great of depths may impact the performance of the epitaxial source/drain regions 292, reducing device performance and causing device defects. As illustrated in FIGS. 39A and 39B, sidewalls of the epitaxial source/drain regions 292 may be contiguous with sidewalls of the third spacers 310. In other embodiments (not separately illustrate), the third recesses 308 may undercut the epitaxial source/drain regions 292 under the third spacers 310, similar to the embodiment illustrated in FIGS. 21C and 21D.

FIG. 39C illustrates a profile of the third recesses 308, in accordance with some embodiments. As shown in the embodiment illustrated in FIG. 39C, sidewalls of the epitaxial source/drain regions 292 adjacent the third recesses 308 may be contiguous with sidewalls of the third spacers 310. Portions of the sidewalls of the epitaxial source/drain regions 292 adjacent the third recesses 308 may be substantially straight and may be inclined to a rounded point. As further illustrated in FIG. 39C, the third recesses 308 may extend through the third semiconductor material layer 292C and partially through the second semiconductor material layer 292B. However, in some embodiments, the third recesses 308 may extend partially through the third semiconductor material layer 292C; through the third semiconductor material layer 292C, through the second semiconductor material layer 292B, and partially through the first semiconductor material layer 292A; or the like.

The third etching process may use a third etchant gas and a fourth etchant gas. The third etchant gas may include fluoromethane ($CH_3F$), difluoromethane ($CH_2F_2$), or the like and the fourth etchant gas may include hydrogen ($H_2$) or the like. A flow rate of the third etchant gas may be from about 10 sccm to about 40 sccm, such as about 15 sccm and a flow rate of the fourth etchant gas may be from about 150 sccm to about 300 sccm, such as about 200 sccm. The third etching process may be performed at a pressure from about 10 mTorr to about 30 mTorr, such as about 15 mTorr and a temperature from about 30° C. to about 60° C., such as about 40° C. A plasma may be generated from the third etchant gas and the fourth etchant gas using a plasma generator at a power from about 150 W to about 300 W, such as about 200 W. A substrate holder on which the substrate 250 is disposed during the third etching process may be biased with a voltage from about 200 V to about 400 V, such as about 300 V.

The fourth etching process may use a fifth etchant gas and a sixth etchant gas. The fifth etchant gas may include nitrogen ($N_2$), argon (Ar), or the like and the sixth etchant gas may include hydrogen ($H_2$) or the like. A flow rate of the fifth etchant gas may be from about 100 sccm to about 300 sccm, such as about 150 sccm and a flow rate of the sixth etchant gas may be from about 150 sccm to about 300 sccm, such as about 200 sccm. The fourth etching process may be performed at a pressure from about 10 mTorr to about 30 mTorr, such as about 15 mTorr and a temperature from about 30° C. to about 60° C., such as about 40° C. A plasma may be generated from the fifth etchant gas and the sixth etchant gas using a plasma generator at a power from about 100 W to about 300 W, such as about 150 W. A substrate holder on which the substrate 250 is disposed during the fourth etching process may be biased with a voltage from about 200 V to about 400 V, such as about 250 V.

Etching the epitaxial source/drain regions 292 using the third etching process may result in a byproduct polymer being formed at the bottom of the third recesses 308 adjacent the epitaxial source/drain regions 292. The fourth etching process may then be used to remove the byproduct polymer. The fourth etching process may be anisotropic and may remove the byproduct polymer from bottom surfaces of the third recesses 308 at a higher rate than the second etching process removes the byproduct polymer from side surfaces of the third recesses 308. As such, the third etching process and the fourth etching process may be used to anisotropically etch the epitaxial source/drain regions 292.

Figure 40B:
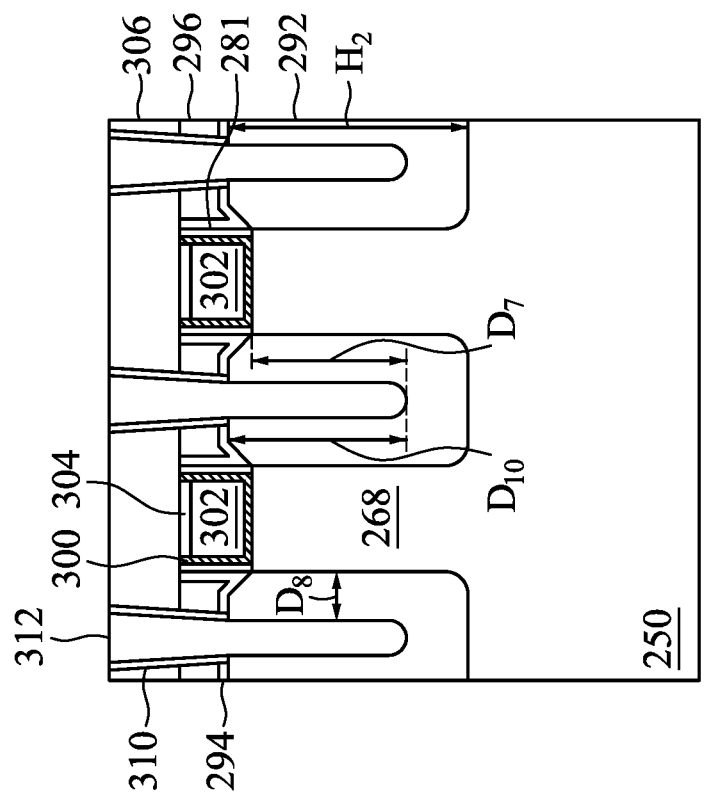
Figure 40A:
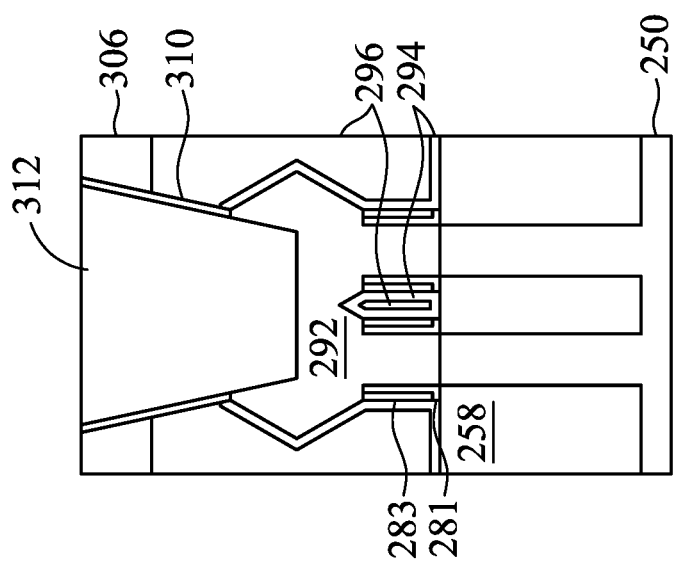
Figure 40C:
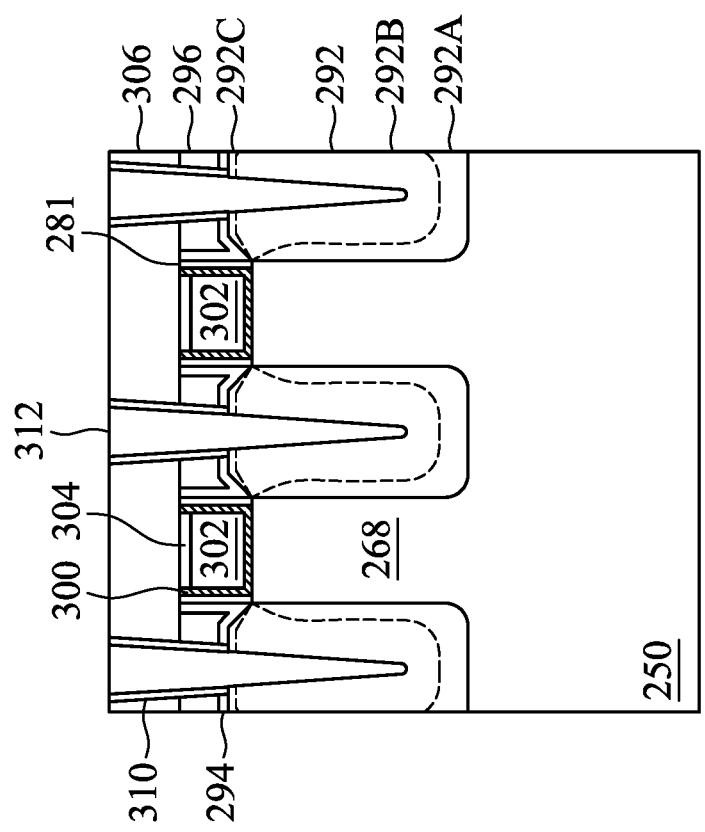

In FIGS. 40A-40C, source/drain contacts 312 are formed. The source/drain contacts 312 are formed in the third recesses 308. A liner, such as a diffusion barrier layer, an adhesion layer, or the like, and a conductive material are formed in the third recesses 308. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. For example, a nitridation process, such as including a nitrogen plasma process, may be performed on the adhesion layer to convert at least the portion of the adhesion layer into the diffusion barrier layer. In some embodiments, the adhesion layer may be completely converted such that no adhesion layer remains and the diffusion barrier layer is an adhesion/barrier layer. In some embodiments, a portion of the adhesion layer remains unconverted such that the portion of the adhesion layer remains with the diffusion barrier layer being on the adhesion layer.

Silicide region may be formed adjacent the epitaxial source/drain regions 292 by reacting a portion of the epitaxial source/drain regions 292 adjacent the liner with the liner. An anneal, such as a rapid thermal anneal (RTA) may be performed to facilitate the reaction of the epitaxial source/drain regions 292 with the liner.

The conductive material may be copper, a copper alloy, silver, gold, tungsten, cobalt, aluminum, nickel, or the like. The conductive material may be deposited by ALD, CVD, PVD, or the like. A planarization process, such as a CMP, may be performed to remove excess material from a surface of the second ILD 306 after the liner and the conductive material are formed. The remaining liner and conductive material form the source/drain contacts 312 in the third recesses 308. The source/drain contacts 312 are physically and electrically coupled to the epitaxial source/drain regions 292. Although the source/drain contacts 312, the third spacers 310, and the epitaxial source/drain regions 292 are illustrated as having the same structures as the source/drain contacts 112, the third spacers 110, and the epitaxial source/drain regions 92 illustrated in FIGS. 22B and 22C, the source/drain contacts 312, the third spacers 310, and the epitaxial source/drain regions 292 may have any of the structures for the source/drain contacts 112, the third spacers 110, and the epitaxial source/drain regions 92 illustrated in FIGS. 21A-22F, or any other suitable structures.

Bottom surfaces of the source/drain contacts 312 may be disposed below top surfaces of the fins 255 by a distance $D_7$ from about 8 nm to about 18 nm, such as about 14 nm. The source/drain contacts 312 may be laterally separated from the fins 255 by a distance $D_8$ from about 4 nm to about 8 nm, such as about 6 nm. The bottom surfaces of the source/drain contacts 312 may extend into the epitaxial source/drain regions 292 to a depth $D_{10}$, which may be greater than about 18 nm or from about 13 nm to about 23 nm, such as about 18 nm, below the top surfaces of the epitaxial source/drain regions 292. A ratio of the depth $D_{10}$ of the source/drain contacts 312 to the height $H_2$ of the epitaxial source/drain regions 292 may be from about 1:3 to about 1:2, such as about 2:5. Forming the epitaxial source/drain regions 292 and the source/drain contacts 312 according to this ratio minimizes source/drain contact resistance ($R_{csd}$), while ensuring sufficient material of the epitaxial source/drain regions 292 remains to effectively function as a source/drain region. Etching the epitaxial source/drain regions 292 to form the third recesses 308 and forming the source/drain contacts 312 in the third recesses 308 reduces the distance between the source/drain contacts 312 and the channel regions 268 of the fins 255. For example, a maximum distance between any of the fins 255 and the source/drain contacts 312 may be from about 4 nm to about 8 nm, such as about 6 nm. This reduces the source/drain contact resistance ($R_{csd}$), which improves device performance of FinFETs formed by the above-described methods.

Figure 41B:
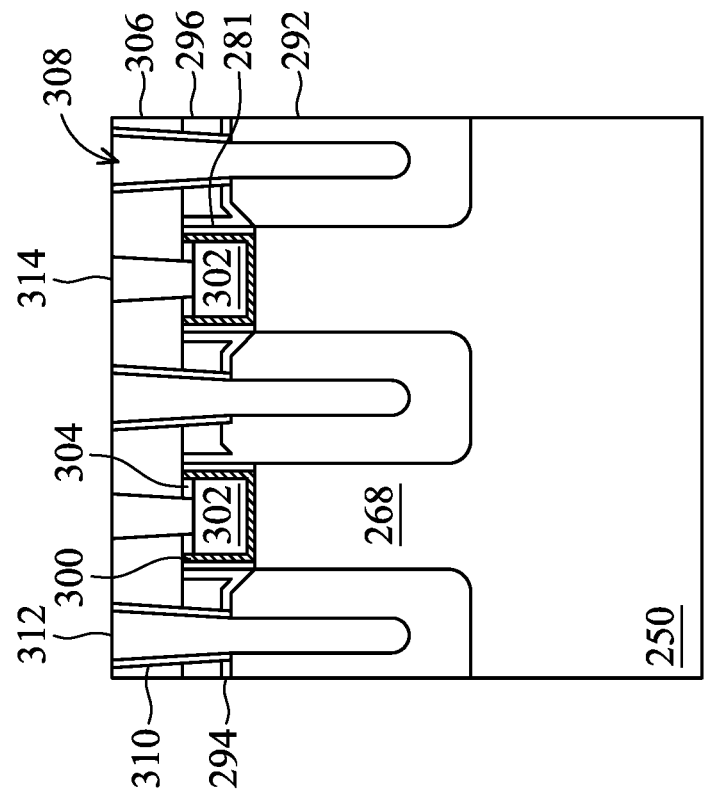
Figure 41A:
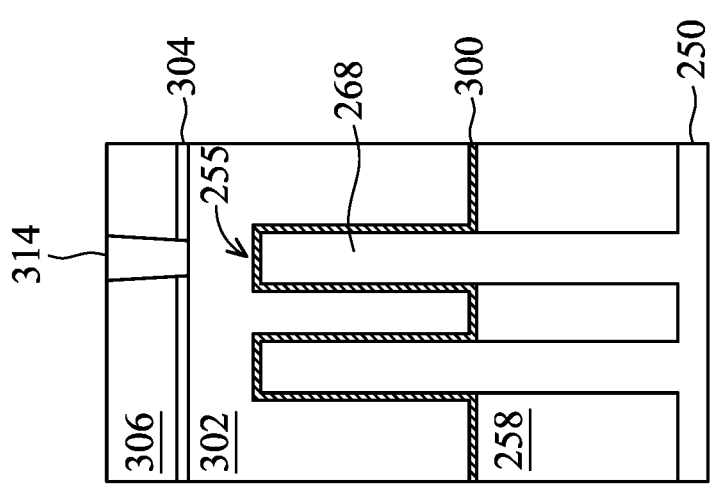

In FIGS. 41A and 41B, gate contacts 314 are formed. Openings for the gate contacts 314 are formed through the second ILD 306 and the gate mask 304. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 306. The remaining liner and conductive material form the gate contacts 314 in the openings. The gate contacts 314 are physically and electrically coupled to the gate electrodes 302. In different embodiments, the gate contacts 314 may be formed by the same processes at the same time as the source/drain contacts 312 or by different processes and before or after the source/drain contacts 312. Although shown as being formed in the same cross-sections, it should be appreciated that each of the source/drain contacts 312 and the gate contacts 314 may be formed in different cross-sections, which may avoid shorting of the contacts.

As discussed above, etching the epitaxial source/drain regions 92 and the epitaxial source/drain regions 292 and forming the source/drain contacts 112 and the source/drain contacts 312 extending into the epitaxial source/drain regions 92 and the epitaxial source/drain regions 292, respectively, reduces source/drain contact resistance ($R_{csd}$), which improves device performance of NSFETs and FinFETs formed by the above-described methods.

In accordance with an embodiment, a semiconductor device includes a semiconductor substrate; a first channel region over the semiconductor substrate; a first gate stack over the semiconductor substrate and surrounding four sides of the first channel region; a first epitaxial source/drain region adjacent the first gate stack and the first channel region; and a first source/drain contact coupled to the first epitaxial source/drain region, a bottommost surface of the first source/drain contact extending below a topmost surface of the first channel region. In an embodiment, the bottommost surface of the first source/drain contact extends below the topmost surface of the first channel region by greater than 15 nm. In an embodiment, the semiconductor device further includes a second channel region below the first channel region, the bottommost surface of the first source/drain contact extending below a topmost surface of the second channel region. In an embodiment, the first source/drain contact extends through a first interlayer dielectric, a spacer separating the first source/drain contact from the first interlayer dielectric. In an embodiment, a topmost surface of the first epitaxial source/drain region is from 10 nm to 20 nm above the bottommost surface of the first source/drain contact. In an embodiment, a bottommost surface of the first gate stack extends below the bottommost surface of the first source/drain contact.

In accordance with another embodiment, a method includes forming a gate stack over a semiconductor substrate; epitaxially growing a first source/drain region in the semiconductor substrate adjacent the gate stack, the epitaxially growing the first source/drain region including epitaxially growing a first semiconductor material; epitaxially growing a second semiconductor material over the first semiconductor material; and epitaxially growing a third semiconductor material over the second semiconductor material, an atomic concentration of a dopant in the first semiconductor material being between an atomic concentration of a dopant in the third semiconductor material and an atomic concentration of a dopant in the second semiconductor material; etching the first source/drain region to form a first recess in the first source/drain region, the first recess extending through the third semiconductor material and partially through the second semiconductor material, a bottommost surface of the first recess being disposed above a bottommost surface of the second semiconductor material, etching the first source/drain region including iteratively etching the first source/drain region using a first etching process and a second etching process having different etchants from the first etching process; and forming a first source/drain contact in the first recess and coupled to the first source/drain region. In an embodiment, etching the first source/drain region with the first etching process includes generating a first plasma from fluoromethane ($CH_3F$) and hydrogen ($H_2$). In an embodiment, etching the first source/drain region with the second etching process includes generating a second plasma from nitrogen ($N_2$) and hydrogen ($H_2$). In an embodiment, the first etching process and the second etching process are repeated for 5 to 20 iterations. In an embodiment, the first etching process etches the first source/drain region and forms a polymer byproduct along surfaces of the first source/drain region, the second etching process etching the polymer byproduct. In an embodiment, the method further includes forming an interlayer dielectric over the gate stack and the first source/drain region; and etching the interlayer dielectric to form a second recess exposing the first source/drain region before etching the first source/drain region to form the first recess. In an embodiment, the first recess has straight sidewalls, a distance between opposite sidewalls of the first recess decreasing from a top of the first recess to the bottommost surface of the first recess.

In accordance with yet another embodiment, a semiconductor device includes a fin over a semiconductor substrate; a gate stack over the fin; an epitaxial source/drain region over the fin adjacent the gate stack; and a source/drain contact coupled to the epitaxial source/drain region, a bottommost surface of the source/drain contact extending below a top surface of the fin a first distance, a ratio of the first distance to a height of the epitaxial source/drain region being from 1:3 to 1:2. In an embodiment, the semiconductor device further includes a gate spacer adjacent the gate stack; and a first interlayer dielectric (ILD) surrounding the gate stack and the gate spacer, the first ILD having a top surface level with top surfaces of the gate stack and the gate spacer, the source/drain contact extending through the first ILD. In an embodiment, the semiconductor device further includes a second ILD over the first ILD, the source/drain contact extending through the second ILD. In an embodiment, the semiconductor device further includes an ILD spacer separating the source/drain contact from the first ILD and the second ILD, the ILD spacer including silicon oxide, silicon nitride, or silicon oxynitride. In an embodiment, the bottommost surface of the source/drain contact extends below a top surface of the epitaxial source/drain region by a distance in a range of 10 nm to 20 nm. In an embodiment, the semiconductor device further includes a second fin over the semiconductor substrate; and a second epitaxial source/drain region over the second fin, the second epitaxial source/drain region being separated from the epitaxial source/drain region, the source/drain contact being coupled to the second epitaxial source/drain region. In an embodiment, the epitaxial source/drain region is a merged epitaxial source/drain region over the fin and a third fin, and the second epitaxial source/drain region is a second merged epitaxial source/drain region over the second fin and a fourth fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a fin over a semiconductor substrate;
    a gate stack over the fin;
    an epitaxial source/drain region over the fin adjacent the gate stack;
    a first interlayer dielectric (ILD) on the epitaxial source/drain region and the gate stack;
    a second ILD over the first ILD;
    a source/drain contact coupled to the epitaxial source/drain region, wherein a bottommost surface of the source/drain contact extends below a top surface of the fin a first distance, wherein a ratio of the first distance to a height of the epitaxial source/drain region is from 1:3 to 1:2, wherein sidewalls of the source/drain contact are inclined to a rounded point, the rounded point being a bottommost point of the source/drain contact, the bottommost point of the source/drain contact being in physical contact with the epitaxial source/drain region; and
    a conformal source/drain contact spacer extending along a side surface of the source/drain contact from adjacent a top surface of the epitaxial source/drain region to level with a top surface of the source/drain contact, the conformal source/drain contact spacer contacting a first side surface of the first ILD and a second side surface of the second ILD from a bottom surface of the first ILD to a top surface of the second ILD.

2. The semiconductor device of claim 1, further comprising:
    a gate spacer adjacent the gate stack, wherein the first ILD surrounds the gate stack and the gate spacer, the first ILD having a top surface level with top surfaces of the gate stack and the gate spacer, the source/drain contact extending through the first ILD.

3. The semiconductor device of claim 1, wherein the source/drain contact extends through the second ILD.

4. The semiconductor device of claim 3, wherein the conformal source/drain contact spacer separates the source/drain contact from the first ILD and the second ILD, the conformal source/drain contact spacer comprising silicon oxide, silicon nitride, or silicon oxynitride.

5. The semiconductor device of claim 1, wherein the bottommost surface of the source/drain contact extends below a top surface of the epitaxial source/drain region by a distance in a range of 10 nm to 20 nm.

6. The semiconductor device of claim 1, further comprising:
    a second fin over the semiconductor substrate; and
    a second epitaxial source/drain region over the second fin, the second epitaxial source/drain region being separated from the epitaxial source/drain region, the source/drain contact being coupled to the second epitaxial source/drain region.

7. The semiconductor device of claim 6, wherein the epitaxial source/drain region is a merged epitaxial source/drain region over the fin and a third fin, and wherein the second epitaxial source/drain region is a second merged epitaxial source/drain region over the second fin and a fourth fin.

8. A semiconductor device comprising:
 a semiconductor substrate;
 a fin over the semiconductor substrate, the fin comprising a first channel region;
 a first gate stack over the semiconductor substrate and surrounding four sides of the first channel region;
 a first epitaxial source/drain region adjacent the first gate stack and the first channel region;
 a contact etch stop layer on the first gate stack and the first epitaxial source/drain region;
 a first interlayer dielectric on the contact etch stop layer;
 a second interlayer dielectric on the first interlayer dielectric;
 a first source/drain contact coupled to the first epitaxial source/drain region, a bottommost surface of the first source/drain contact extending a first distance below a topmost surface of the first channel region, wherein the first source/drain contact has a stepped profile having a first width above a topmost surface of the first epitaxial source/drain region and stepping to a second width greater than the first width below the topmost surface of the first epitaxial source/drain region; and
 a spacer in physical contact with each of the first epitaxial source/drain region, the contact etch stop layer, the first interlayer dielectric, and the second interlayer dielectric, wherein in a cross-sectional view, a width between a first outermost point and a second outermost point of the spacer is smaller than a width of the first epitaxial source/drain region.

9. The semiconductor device of claim 8, wherein the first distance is greater than 15 nm.

10. The semiconductor device of claim 8, wherein a ratio of the first distance to a height of the first source/drain contact is from 1:3 to 1:2.

11. The semiconductor device of claim 8, wherein the first source/drain contact extends through the first interlayer dielectric, wherein the spacer separates the first source/drain contact from the first interlayer dielectric.

12. The semiconductor device of claim 11, wherein a topmost surface of the first epitaxial source/drain region is from 10 nm to 20 nm above the bottommost surface of the first source/drain contact.

13. The semiconductor device of claim 11, wherein the spacer comprises silicon oxide, silicon nitride, or silicon oxynitride.

14. A device comprising:
 a gate stack over a first fin, the first fin extending from a semiconductor substrate;
 a plurality of channel regions on the first fin in a first direction perpendicular to a major surface of the semiconductor substrate;
 a first source/drain region in the semiconductor substrate adjacent the gate stack, the first source/drain region comprising:
  a first semiconductor material;
  a second semiconductor material over the first semiconductor material; and
  a third semiconductor material over the second semiconductor material, wherein an atomic concentration of a first dopant in the first semiconductor material is between an atomic concentration of a second dopant in the third semiconductor material and an atomic concentration of a third dopant in the second semiconductor material;
 a first source/drain contact coupled to the first source/drain region, wherein the first source/drain contact extends through the third semiconductor material and partially through the second semiconductor material, wherein a bottommost surface of the first source/drain contact is disposed above a bottommost surface of the second semiconductor material, wherein the first source/drain contact extends in the first direction to below a bottommost surface of a topmost channel region of the plurality of channel regions, and wherein the first source/drain contact extends in the first direction to at least a level coplanar with a bottommost surface of a bottommost channel region of the plurality of channel regions, the topmost channel region of the plurality of channel regions being different from the bottommost channel region of the plurality of channel regions;
 an interlayer dielectric over the gate stack and the first source/drain region, the first source/drain contact extending through the interlayer dielectric; and
 a first interlayer dielectric spacer between the interlayer dielectric and the first source/drain contact, the first interlayer dielectric spacer extending along a side surface of the interlayer dielectric from a bottom surface of the interlayer dielectric to a top surface of the interlayer dielectric.

15. The device of claim 14, wherein the first source/drain contact is laterally separated from the first fin by a distance ranging from 4 nm to 8 nm.

16. The device of claim 14, wherein the first source/drain contact has straight sidewalls, wherein a distance between opposite sidewalls of the first source/drain contact decreases from a top of the first source/drain contact to the bottommost surface of the first source/drain contact.

17. The device of claim 14, wherein the first source/drain contact extends a distance ranging from 8 nm to 18 nm below a topmost surface of the first fin.

18. The device of claim 14, wherein the first source/drain contact extends a distance ranging from 13 nm to 23 nm below a topmost surface of the third semiconductor material.

19. The device of claim 14, wherein the first interlayer dielectric spacer comprises silicon oxide, silicon nitride, or silicon oxynitride.

20. The device of claim 14, further comprising a second interlayer dielectric over the interlayer dielectric, wherein the first interlayer dielectric spacer extends along a side surface of the second interlayer dielectric from a bottom surface of the second interlayer dielectric to a top surface of the second interlayer dielectric.

* * * * *